(12) United States Patent
Ozawa et al.

(10) Patent No.: US 12,219,274 B2
(45) Date of Patent: Feb. 4, 2025

(54) IMAGING DEVICE AND IMAGING METHOD

(71) Applicant: SONY SEMICONDUCTOR SOLUTIONS CORPORATION, Kanagawa (JP)

(72) Inventors: Yuki Ozawa, Kanagawa (JP); Takehiro Otani, Kanagawa (JP); Tomoyuki Hiro, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 92 days.

(21) Appl. No.: 17/915,015

(22) PCT Filed: Mar. 30, 2021

(86) PCT No.: PCT/JP2021/013462
§ 371 (c)(1),
(2) Date: Sep. 27, 2022

(87) PCT Pub. No.: WO2021/205937
PCT Pub. Date: Oct. 14, 2021

(65) Prior Publication Data
US 2023/0156354 A1 May 18, 2023

(30) Foreign Application Priority Data
Apr. 10, 2020 (JP) ................. 2020-071037

(51) Int. Cl.
*H04N 25/47* (2023.01)
*H01L 27/146* (2006.01)
(Continued)

(52) U.S. Cl.
CPC ....... *H04N 25/47* (2023.01); *H01L 27/14634* (2013.01); *H04N 25/77* (2023.01); *H04N 25/79* (2023.01)

(58) Field of Classification Search
CPC ........ H04N 25/47; H04N 25/77; H04N 25/79; H01L 27/14634; H01L 27/14643
See application file for complete search history.

(56) References Cited

U.S. PATENT DOCUMENTS

| | | | | |
|---|---|---|---|---|
| 11,470,273 B2 * | 10/2022 | Niwa | ...................... | H04N 25/47 |
| 11,770,629 B2 * | 9/2023 | Kitano | ................... | H04N 25/63 |
| | | | | 348/243 |

(Continued)

FOREIGN PATENT DOCUMENTS

| | | |
|---|---|---|
| JP | 2008-523695 A | 7/2008 |
| JP | 2018-148553 A | 9/2018 |

(Continued)

OTHER PUBLICATIONS

International Search Report and Written Opinion of PCT Application No. PCT/JP2021/013462, issued on Jun. 8, 2021, 08 pages of ISRWO.

*Primary Examiner* — Kelly L Jerabek
(74) *Attorney, Agent, or Firm* — CHIP LAW GROUP

(57) ABSTRACT

An event can be detected quickly and accurately regardless of surrounding brightness. An imaging device includes: a photoelectric conversion element that photoelectrically converts incident light and generates an electrical signal corresponding to incident light intensity; a detection unit that outputs a detection signal indicating whether or not a change amount of the electrical signal exceeds a predetermined threshold value; and a threshold value selection circuit that selects the threshold value from among a plurality of threshold value candidates according to a magnitude of the electrical signal.

17 Claims, 34 Drawing Sheets

(51) Int. Cl.
*H04N 25/77* (2023.01)
*H04N 25/79* (2023.01)

(56) References Cited

U.S. PATENT DOCUMENTS

| | | | |
|---|---|---|---|
| 2016/0093273 A1* | 3/2016 | Wang | G01S 3/781 |
| | | | 345/428 |
| 2021/0152762 A1* | 5/2021 | Sakakibara | H04N 25/60 |
| 2022/0053154 A1* | 2/2022 | Kitano | H01L 27/14623 |
| 2023/0140880 A1* | 5/2023 | Nomoto | H04N 25/75 |
| | | | 348/241 |

FOREIGN PATENT DOCUMENTS

| | | |
|---|---|---|
| JP | 2020-053827 A | 4/2020 |
| WO | 2019/135303 A1 | 7/2019 |

\* cited by examiner

| TRUTH VALUE TABLE ⇧ | Von | Voff |
|---|---|---|
| EVENT SIGNAL ⇧ | 1 | 1 |
| EVENT SIGNAL ⇩ | 0 | 0 |
| NO EVENT | 0 | 1 |

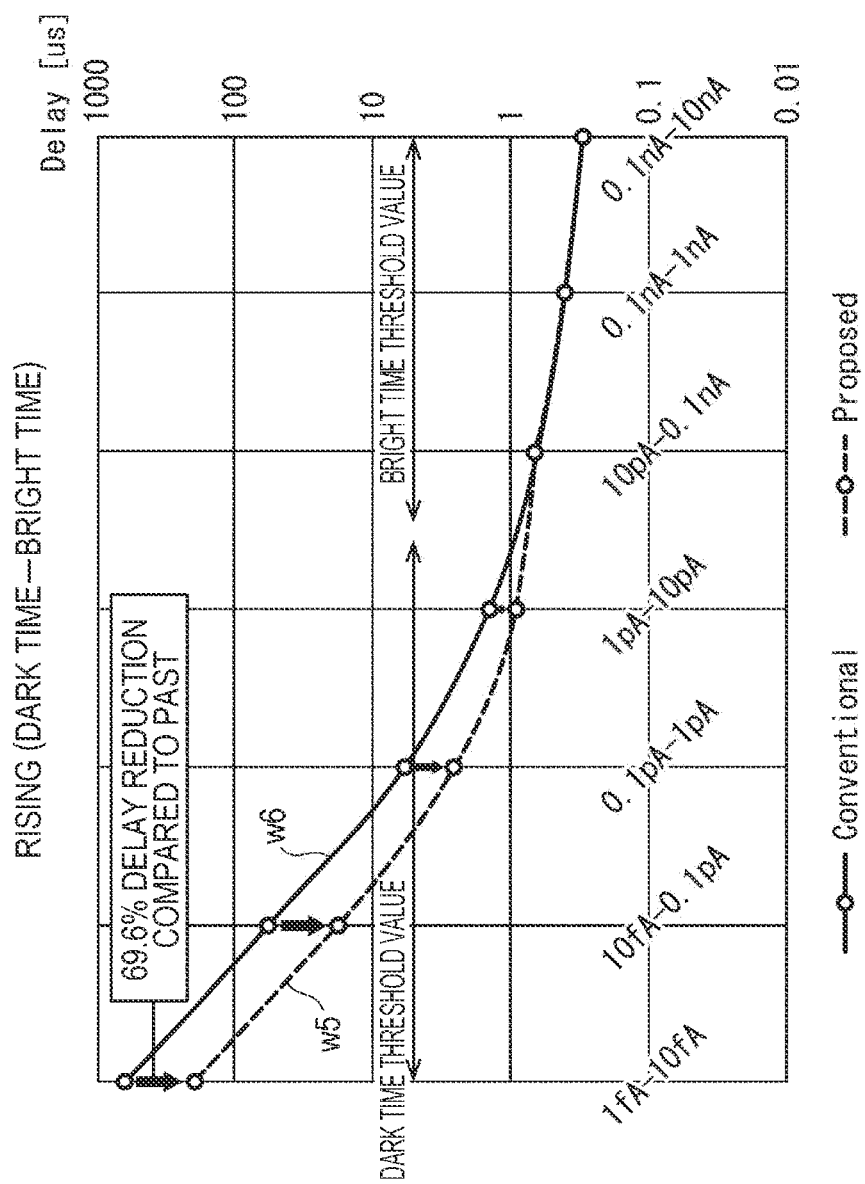

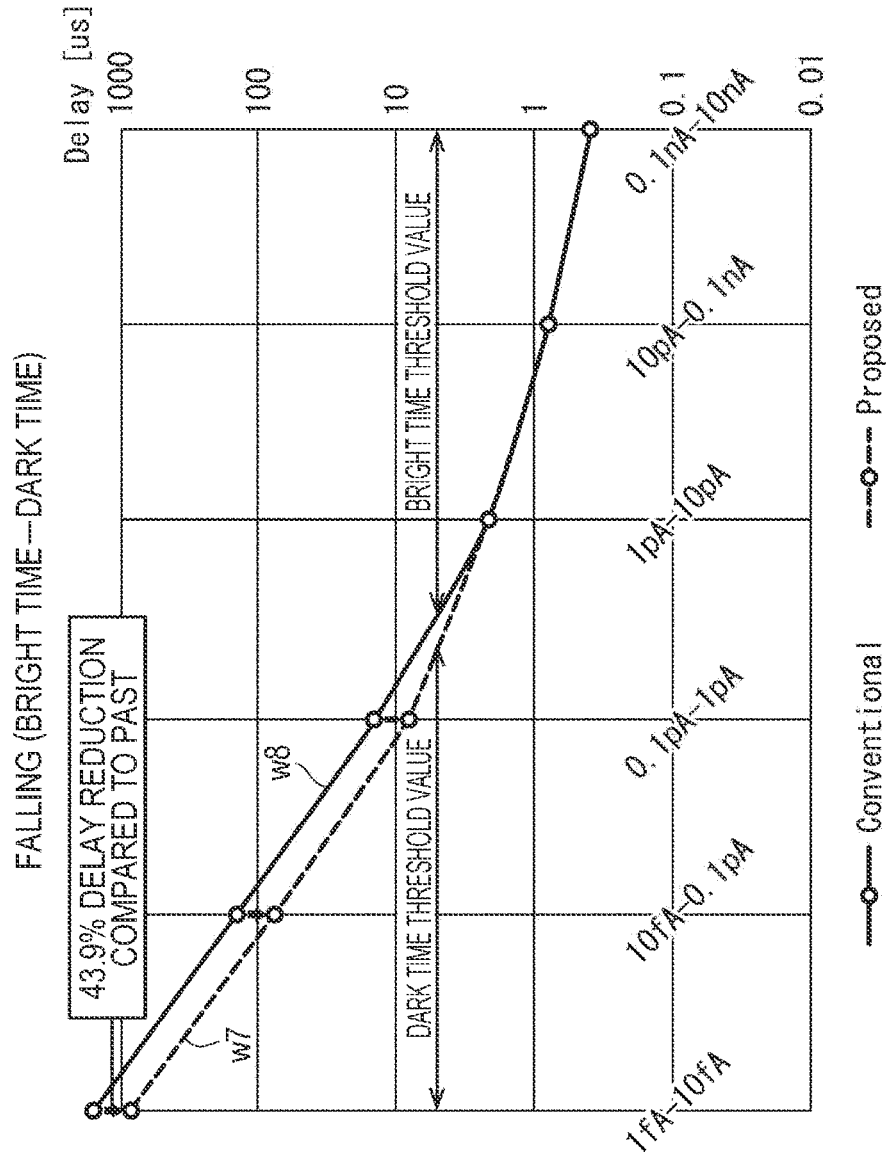

IMAGING DEVICE AND IMAGING METHOD

CROSS REFERENCE TO RELATED APPLICATIONS

This application is a U.S. National Phase of International Patent Application No. PCT/JP2021/013462 filed on Mar. 30, 2021, which claims priority benefit of Japanese Patent Application No. JP 2020-071037 filed in the Japan Patent Office on Apr. 10, 2020. Each of the above-referenced applications is hereby incorporated herein by reference in its entirety.

TECHNICAL FIELD

The present disclosure relates to an imaging device and an imaging method.

BACKGROUND ART

In a conventional imaging device, a synchronous imaging element that captures image data (frames) in synchronization with a synchronization signal such as a vertical synchronization signal is generally used. This type of synchronous imaging element can acquire image data only in every cycle (for example, 1/60 seconds) of a synchronization signal, and thus is not suitable for use in acquiring image data at a higher speed. Therefore, an asynchronous imaging element has been proposed in which an event detection circuit that detects, for every pixel address, that the light amount of the pixel exceeds a threshold value as an event in real time is provided for every pixel (see, for example, Patent Document 1). In this imaging element, a photodiode and a plurality of transistors for detecting an event are arranged for each pixel.

CITATION LIST

Patent Document

Patent Document 1: JP 2018-148553 A
Patent Literature 2: JP 2008-523695 A

SUMMARY OF THE INVENTION

Problems to be Solved by the Invention

In the above-described asynchronous imaging element, data can be generated and output at a much higher speed than in the synchronous imaging element. For this reason, for example, in the traffic field, it is possible to improve safety by executing processing of recognizing an image of a person or an obstacle at high speed.

However, in a case where the surroundings of the imaging device are dark, the current flowing through the photoelectric conversion element becomes too small, and it takes time to accumulate charges in the parasitic capacitance of the pixel circuit, in a manner that the operation speed decreases. By adjusting the threshold value for event detection, the detection sensitivity of the event can be increased, but noise is easily picked up at bright time, and false detection of the event increases.

Therefore, the present disclosure provides an imaging device and an imaging method capable of quickly and accurately detecting an event regardless of ambient brightness.

Solutions to Problems

In order to solve the above problems, according to the present disclosure, there is provided an imaging device including:
  a photoelectric conversion element that photoelectrically converts incident light and generates an electrical signal corresponding to incident light intensity;
  a detection unit that outputs a detection signal indicating whether or not a change amount of the electrical signal exceeds a predetermined threshold value; and
  a threshold value selection circuit that selects the threshold value from among a plurality of threshold value candidates according to a magnitude of the electrical signal.

The electrical signal may be a current flowing through the photoelectric conversion element, and
  the threshold value selection circuit may select the threshold value candidates different from each other as the threshold value depending on whether or not a current flowing through the photoelectric conversion element exceeds a predetermined current value.

In a case where the current flowing through the photoelectric conversion element exceeds the predetermined current value, the threshold value selection circuit may select the threshold value candidate having a larger absolute value as the threshold value as compared with a case where the current flowing through the photoelectric conversion element is equal to or less than the predetermined current value.

The threshold value selection circuit may select the different threshold value candidates as the threshold value depending on whether the electrical signal changes in an increasing direction or a decreasing direction.

In a case where the current flowing through the photoelectric conversion element exceeds the predetermined current value, the threshold value selection circuit may select, as the threshold value, a first threshold value candidate in a case where the electrical signal changes in the increasing direction and a second threshold value candidate in a case where the electrical signal changes in the decreasing direction, and
  in a case where the current flowing through the photoelectric conversion element is equal to or less than the predetermined current value, the threshold value selection circuit may select, as the threshold value, a third threshold value candidate in a case where the electrical signal changes in the increasing direction and a fourth threshold value candidate in a case where the electrical signal changes in the decreasing direction.

A difference between the first threshold value candidate and the second threshold value candidate may be larger than a difference between the third threshold value candidate and the fourth threshold value candidate.

The detection unit may include a first transistor and a second transistor that output a signal corresponding to the change amount of the electrical signal,
  the threshold value selection circuit may include
  a first current source that causes a current corresponding to the first threshold value candidate to flow,
  a second current source that causes a current corresponding to the second threshold value candidate to flow,
  a third current source that causes a current corresponding to the third threshold value candidate to flow, and
  a fourth current source that causes a current corresponding to the fourth threshold value candidate to flow,
  in a case where the current flowing through the photoelectric conversion element exceeds the predetermined current value, a switching unit may connect the first current source to an output current path of the first transistor and connects the second current source to an output current path of the second transistor, and in a case where a current flowing through the photoelectric conversion element is equal to or less than the predetermined current value, the switching unit may connect the third current source to the output current path of the first transistor, and connects the fourth current source to the output current path of the second transistor.

The first current source may be a third transistor having a gate to which a voltage of the first threshold value candidate is input, the second current source may be a fourth transistor having a gate to which a voltage of the second threshold value candidate is input, the third current source may be a fifth transistor having a gate to which a voltage of the third threshold value candidate is input, and the fourth current source may be a sixth transistor having a gate to which a voltage of the fourth threshold value candidate is input.

The threshold value selection circuit may include a first selection unit that switches the third transistor or the fifth transistor to be cascode-connected to the first transistor depending on whether or not the current flowing through the photoelectric conversion element exceeds the predetermined current value, and a second selection unit that switches the fourth transistor or the sixth transistor to be cascode-connected to the second transistor depending on whether or not the current flowing through the photoelectric conversion element exceeds the predetermined current value.

The first selection unit and the second selection unit may perform switching on the basis of a result of comparison between the current flowing through the photoelectric conversion element and a predetermined reference current.

A reference current source that generates the predetermined reference current; and a monitoring circuit that compares the predetermined reference current with the current flowing through the photoelectric conversion element and outputs a voltage signal indicating a comparison result may be included.

The first selection unit and the second selection unit may perform switching on the basis of the voltage signal.

A pixel array unit including a plurality of pixel circuits each including the photoelectric conversion element may be included.

A threshold value variable circuit including the detection unit and the threshold value selection circuit, and the monitoring circuit may be provided for each of the plurality of pixel circuits.

A pixel array unit including the plurality of pixel circuits each including the photoelectric conversion element may be included.

The threshold value variable circuit including the detection unit and the threshold value selection circuit may be provided for each of the plurality of pixel circuits, and the monitoring circuit may be provided for every pixel group including two or more pixel circuits among the plurality of pixel circuits.

A first substrate on which the pixel array unit is arranged; and a second substrate laminated on the first substrate and on which the threshold value variable circuit and the monitoring circuit are arranged may be included.

The first substrate and the second substrate may be bonded to each other by any of a chip on chip (CoC) method, a chip on wafer (CoW) method, or a wafer on wafer (WoW) method.

The reference current source may be provided separately from the pixel circuit, and the reference current source can vary the reference current.

According to the present disclosure, there is provided an imaging method including:

photoelectrically converting incident light and generating an electrical signal corresponding to incident light intensity by a photoelectric conversion element;

outputting a detection signal indicating whether or not a change amount of the electrical signal exceeds a predetermined threshold value; and selecting the threshold value from among a plurality of threshold value candidates according to a magnitude of the electrical signal.

BRIEF DESCRIPTION OF DRAWINGS

FIG. 30A is a graph comparing characteristics of a delay time when an event signal Von rises between FIGS. 24 and 8.

FIG. 30B is a graph comparing characteristics of a delay time when the event signal Von falls between FIGS. 24 and 8.

MODE FOR CARRYING OUT THE INVENTION

Hereinafter, embodiments of an imaging device and an imaging method will be described with reference to the drawings. Although main components of the imaging device will be mainly described below, the imaging device may have components and functions that are not illustrated or described. The following description does not exclude components and functions that are not illustrated or described.

Figure 1:
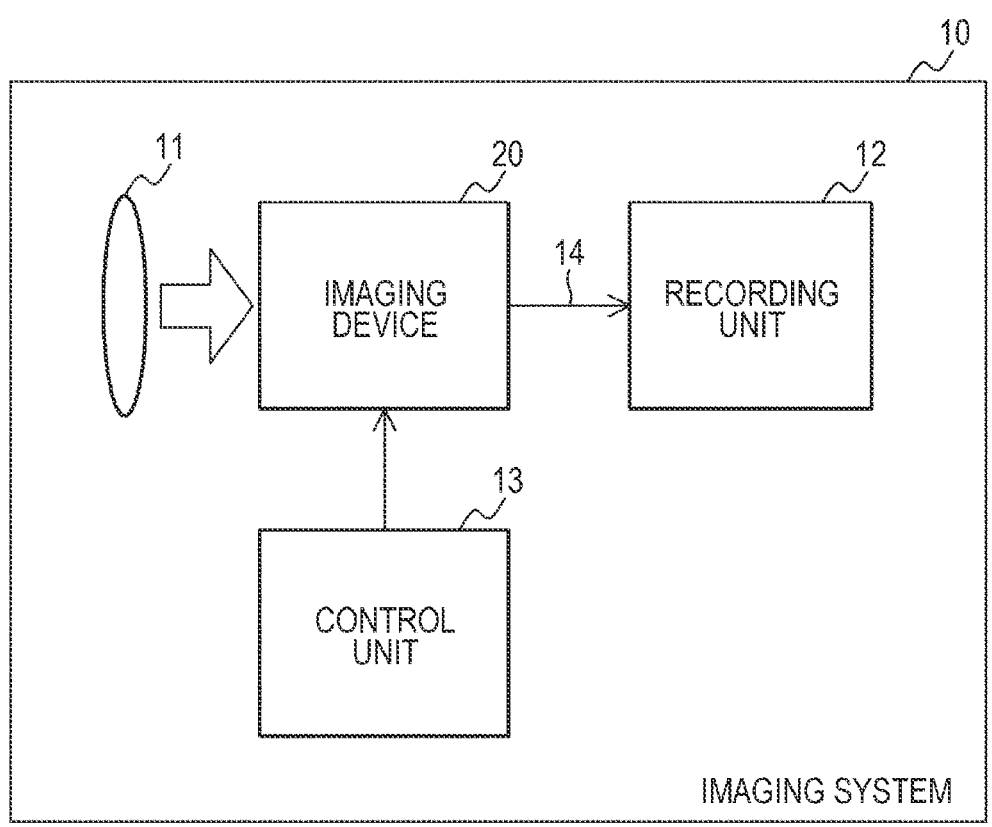
FIG. 1 is a block diagram illustrating an example of a system configuration of an imaging system.

FIG. 1 is a block diagram illustrating an example of a system configuration of an imaging system to which the technology according to the present disclosure is applied.

As illustrated in FIG. 1, an imaging system 10 to which the technology according to the present disclosure is applied includes an imaging lens 11, an imaging device 20, a recording unit 12, and a control unit 13. The imaging system 10 is an example of an electronic device of the present disclosure, and examples of the electronic device include a camera system mounted on an industrial robot, an on-board camera system, and the like.

In the imaging system 10 having the above configuration, the imaging lens 11 captures incident light from a subject and forms an image on an imaging surface of the imaging device 20. The imaging device 20 photoelectrically converts incident light captured by the imaging lens 11 in units of pixels to acquire imaging data. As the imaging device 20, an imaging device of the present disclosure described later is used.

The imaging device 20 executes predetermined signal processing such as image recognition processing on the captured image data, and outputs data indicating a processing result and a detection signal (hereinafter, it may be simply described as a "detection signal") of an address event to be described later to the recording unit 12. A method of generating the detection signal of the address event will be described later. The recording unit 12 stores data supplied from the imaging device 20 via a signal line 14. The control unit 13 includes, for example, a microcomputer, and controls an imaging operation in the imaging device 20.

[Imaging Device According to First Configuration Example (Arbiter Method)]

Figure 2:
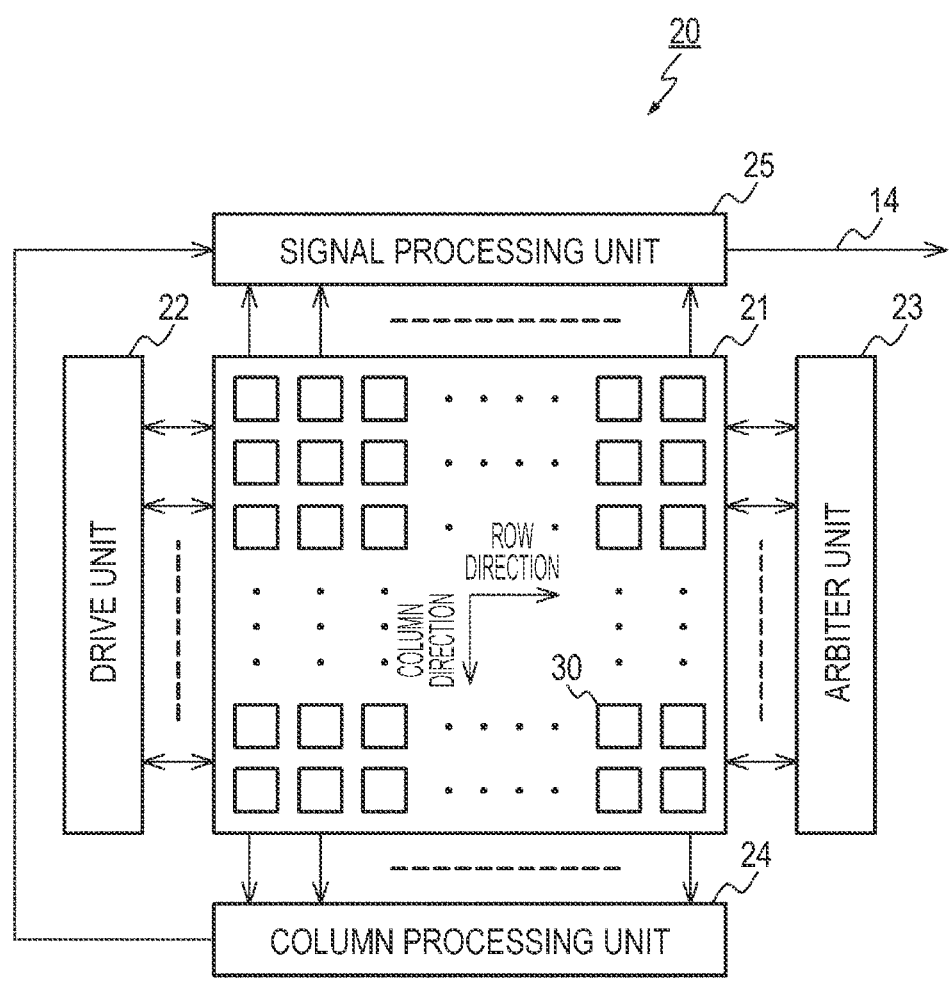
FIG. 2 is a block diagram illustrating an example of a configuration of an imaging device according to a first configuration example.

FIG. 2 is a block diagram illustrating an example of a configuration of an imaging device according to a first configuration example used as the imaging device 20 in the imaging system 10 to which the technology according to the present disclosure is applied.

As illustrated in FIG. 2, the imaging device 20 according to the first configuration example as the imaging device of the present disclosure is an asynchronous imaging device called event base vision sensor (EVS), and includes a pixel array unit 21, a drive unit 22, an arbiter unit (arbitration unit) 23, a column processing unit 24, and a signal processing unit 25.

In the imaging device 20 having the above configuration, a plurality of pixels 30 is two-dimensionally arranged in a matrix (array) in the pixel array unit 21. A vertical signal line VSL to be described later is wired for each pixel column with respect to this matrix-like pixel arrangement.

Each of the plurality of pixels 30 generates an analog signal of a voltage corresponding to a photocurrent as a pixel signal. Furthermore, each of the plurality of pixels 30 detects the presence or absence of an address event on the basis of whether or not the change amount of the photocurrent exceeds a predetermined threshold value. Then, when an address event occurs, the pixel 30 outputs a request to the arbiter unit 23.

The drive unit 22 drives each of the plurality of pixels 30 to output the pixel signal generated in each pixel 30 to the column processing unit 24.

The arbiter unit 23 arbitrates a request from each of the plurality of pixels 30 and transmits a response based on the arbitration result to the pixel 30. The pixel 30 that has received the response from the arbiter unit 23 supplies a detection signal indicating a detection result (detection signal of the address event) to the drive unit 22 and the signal processing unit 25. The reading of the detection signal from the pixel 30 can be performed by reading a plurality of rows.

The column processing unit 24 includes, for example, an analog-digital converter, and performs processing of converting an analog pixel signal output from the pixel 30 of the row into a digital signal for each pixel column of the pixel array unit 21. Then, the column processing unit 24 supplies the analog-digital converted digital signal to the signal processing unit 25.

The signal processing unit 25 executes predetermined signal processing such as correlated double sampling (CDS) processing or image recognition processing on the digital signal supplied from the column processing unit 24. Then, the signal processing unit 25 supplies the data indicating the processing result and the detection signal supplied from the arbiter unit 23 to the recording unit 12 (see FIG. 1) via signal line 14.

[Configuration Example of Pixel Array Unit]

Figure 3:
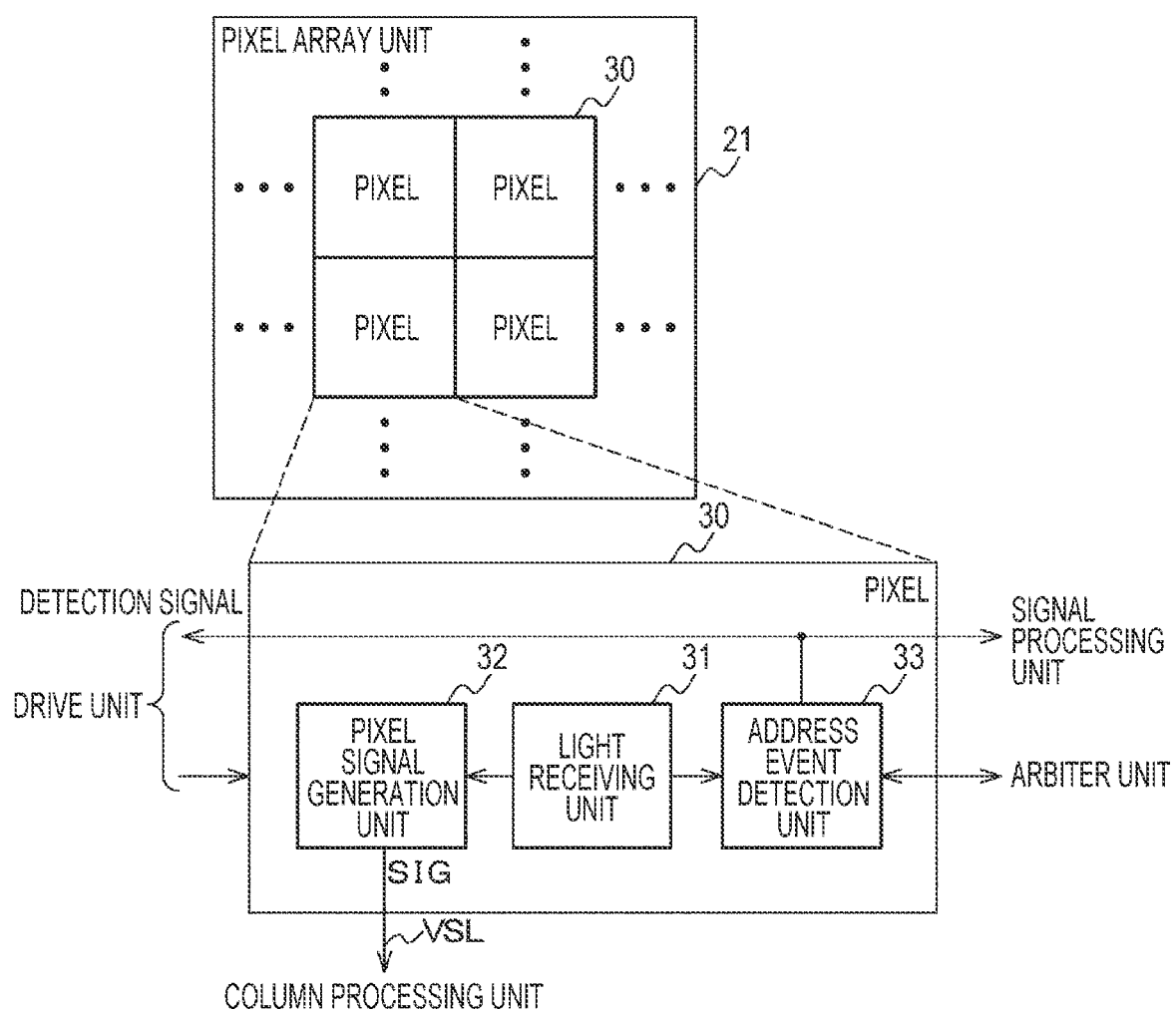
FIG. 3 is a block diagram illustrating an example of a configuration of a pixel array unit.

FIG. 3 is a block diagram illustrating an example of a configuration of the pixel array unit 21.

In the pixel array unit 21 in which the plurality of pixels 30 is two-dimensionally arranged in a matrix, each of the plurality of pixels 30 includes a light receiving unit 31, a pixel signal generation unit 32, and an address event detection unit 33.

In the pixel 30 having the above configuration, the light receiving unit 31 photoelectrically converts the incident light to generate a photocurrent. Then, the light receiving unit 31 supplies the photocurrent generated by photoelectric conversion to either the pixel signal generation unit 32 or the address event detection unit 33 under the control of the drive unit 22 (see FIG. 2).

The pixel signal generation unit 32 generates a signal of a voltage corresponding to the photocurrent supplied from the light receiving unit 31 as a pixel signal SIG, and supplies the generated pixel signal SIG to the column processing unit 24 (see FIG. 2) via the vertical signal line VSL.

The address event detection unit 33 detects the presence or absence of an address event on the basis of whether or not the change amount of photocurrent from each of the light receiving unit 31 exceeds a predetermined threshold value. The address event includes, for example, an on-event indicating that the change amount of the photocurrent exceeds the upper limit threshold value and an off-event indicating that the change amount falls below the lower limit threshold value. Furthermore, the detection signal of the address event includes, for example, one bit indicating the detection result of the on-event and one bit indicating the detection result of the off-event. Note that the address event detection unit 33 can be configured to detect only an on-event.

When an address event occurs, the address event detection unit 33 supplies a request for requesting transmission of a detection signal of the address event to the arbiter unit 23 (see FIG. 2). Then, upon receiving a response to the request from the arbiter unit 23, the address event detection unit 33 supplies a detection signal of the address event to the drive unit 22 and the signal processing unit 25.

[Circuit Configuration Example of Pixel]

Figure 4:
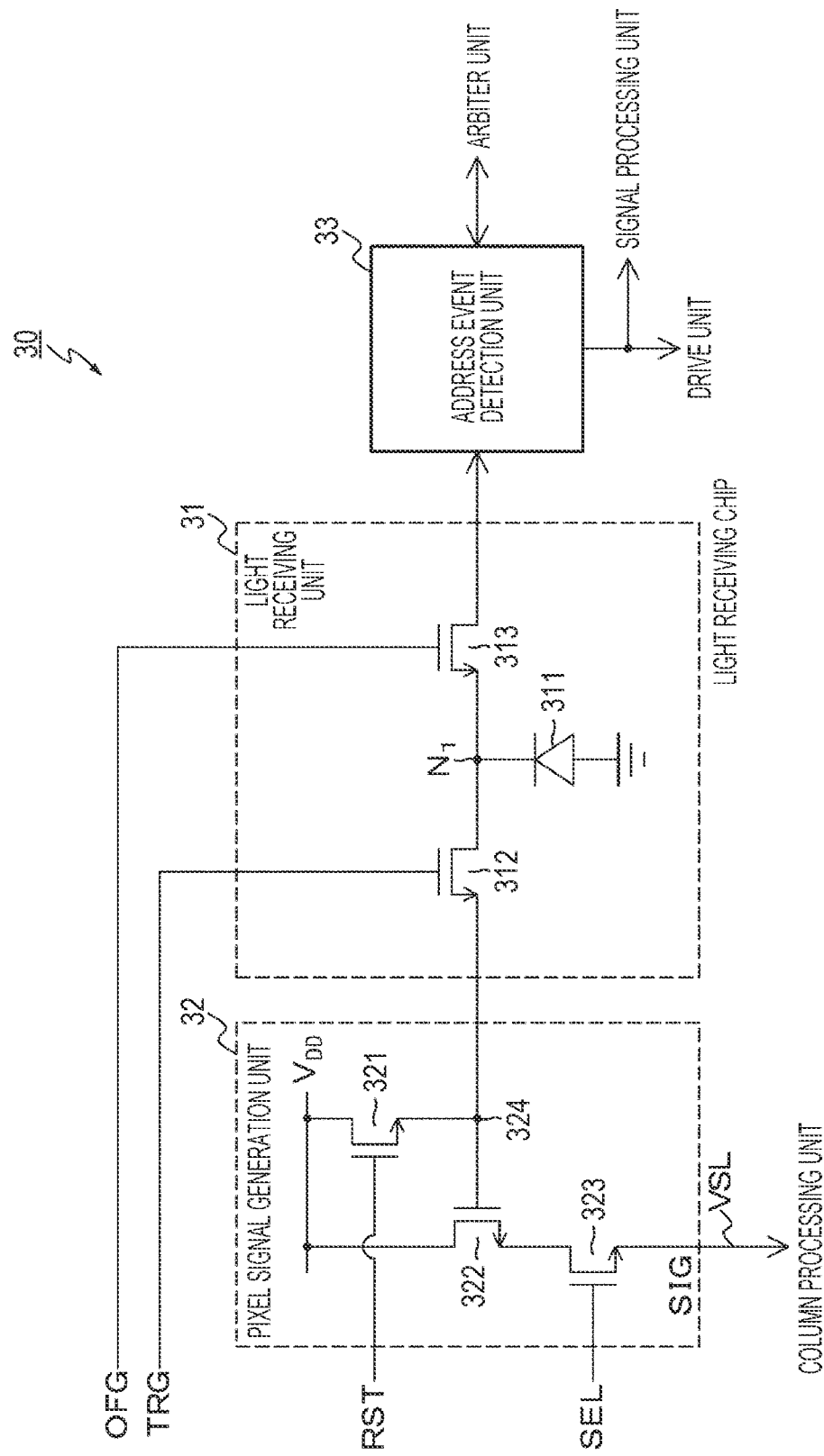
FIG. 4 is a circuit diagram illustrating an example of a circuit configuration of a pixel.

FIG. 4 is a circuit diagram illustrating an example of a circuit configuration of the pixel 30. As described above, each of the plurality of pixels 30 includes a light receiving unit 31, a pixel signal generation unit 32, and an address event detection unit 33.

In the pixel 30 having the above configuration, the light receiving unit 31 includes a light receiving element (photoelectric conversion element) 311, a transfer transistor 312, and an over flow gate (OFG) transistor 313. As the transfer transistor 312 and the OFG transistor 313, for example, an N-type metal oxide semiconductor (MOS) transistor is used. The transfer transistor 312 and the OFG transistor 313 are connected in series to each other.

The light receiving element 311 is connected between a common connection node Ni of the transfer transistor 312 and the OFG transistor 313 and the ground, and photoelectrically converts the incident light to generate a charge of a charge amount corresponding to the amount of the incident light.

A transfer signal TRG is supplied from the drive unit 22 illustrated in FIG. 2 to the gate electrode of the transfer transistor 312. In response to the transfer signal TRG, the transfer transistor 312 supplies the charge photoelectrically converted by the light receiving element 311 to the pixel signal generation unit 32.

A control signal OFG is supplied from the drive unit 22 to the gate electrode of the OFG transistor 313. In response to the control signal OFG, the OFG transistor 313 supplies the electrical signal generated by the light receiving element 311 to the address event detection unit 33. The electrical signal supplied to the address event detection unit 33 is a photocurrent including charges.

The pixel signal generation unit 32 includes a reset transistor 321, an amplification transistor 322, a selection transistor 323, and a floating diffusion layer 324. As the reset transistor 321, the amplification transistor 322, and the selection transistor 323, for example, an N-type MOS transistor is used.

The charge photoelectrically converted by the light receiving element 311 is supplied from the light receiving unit 31 to the pixel signal generation unit 32 by the transfer transistor 312. The charge supplied from the light receiving unit 31 is accumulated in the floating diffusion layer 324. The floating diffusion layer 324 generates a voltage signal having a voltage value corresponding to the amount of accumulated charges. That is the floating diffusion layer 324 converts electric charge into voltage.

The reset transistor 321 is connected between the power line of a power supply voltage $V_{DD}$ and the floating diffusion layer 324. A reset signal RST is supplied from the drive unit 22 to the gate electrode of the reset transistor 321. The reset transistor 321 initializes (resets) the charge amount of the floating diffusion layer 324 in response to the reset signal RST.

The amplification transistor 322 is connected in series with the selection transistor 323 between the power line of the power supply voltage $V_{DD}$ and the vertical signal line VSL. The amplification transistor 322 amplifies the voltage signal subjected to charge-voltage conversion by the floating diffusion layer 324.

A selection signal SEL is supplied from the drive unit 22 to the gate electrode of the selection transistor 323. In response to the selection signal SEL, the selection transistor 323 outputs the voltage signal amplified by the amplification transistor 322 to the column processing unit 24 (see FIG. 2) via the vertical signal line VSL as the pixel signal SIG.

In the imaging device 20 including the pixel array unit 21 in which the pixels 30 having the above-described configuration are two-dimensionally arranged, when the control unit 13 illustrated in FIG. 1 gives an instruction to start detection of an address event, the drive unit 22 supplies the control signal OFG to the OFG transistor 313 of the light receiving unit 31, driving the OFG transistor 313 to supply photocurrent to the address event detection unit 33.

Then, when an address event is detected in a certain pixel 30, the drive unit 22 turns off the OFG transistor 313 of the pixel 30 and stops the supply of photocurrent to the address event detection unit 33. Next, the drive unit 22 drives the transfer transistor 312 by supplying the transfer signal TRG to the transfer transistor 312, and transfers the charge photoelectrically converted by the light receiving element 311 to the floating diffusion layer 324.

In this manner, the imaging device 20 including the pixel array unit 21 in which the pixels 30 having the above-described configuration are two-dimensionally arranged outputs only the pixel signal of the pixel 30 in which the address event is detected to the column processing unit 24. Therefore, regardless of the presence or absence of an address event, the power consumption of the imaging device 20 and the processing amount of the image processing can be reduced as compared with the case of outputting the pixel signals of all the pixels.

Note that the configuration of the pixel 30 exemplified here is an example, and is not limited to this configuration example. For example, the pixel configuration does not have to not include the pixel signal generation unit 32. In the case of this pixel configuration, in the light receiving unit 31, it is only required to omit the OFG transistor 313 and cause the transfer transistor 312 to have the function of the OFG transistor 313.

Figure 5:
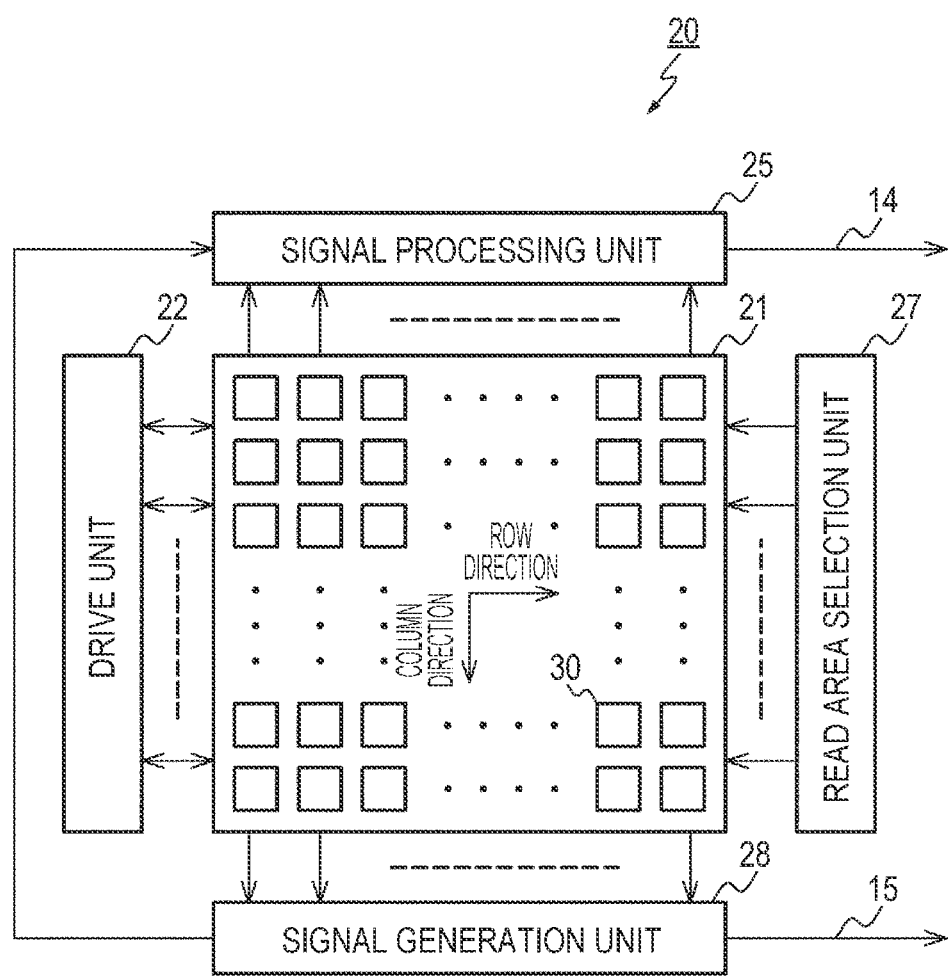
FIG. 5 is a block diagram illustrating an example of a configuration of a scanning type imaging device.

FIG. 5 is a block diagram illustrating an example of a configuration of an imaging device according to a second configuration example, that is a scanning type imaging device used as the imaging device 20 in the imaging system 10 to which the technology according to the present disclosure is applied.

As illustrated in FIG. 5, the imaging device 20 according to the second configuration example as the imaging device of the present disclosure includes the pixel array unit 21, the drive unit 22, the signal processing unit 25, a read area selection unit 27, and a signal generation unit 28.

Figure 7:
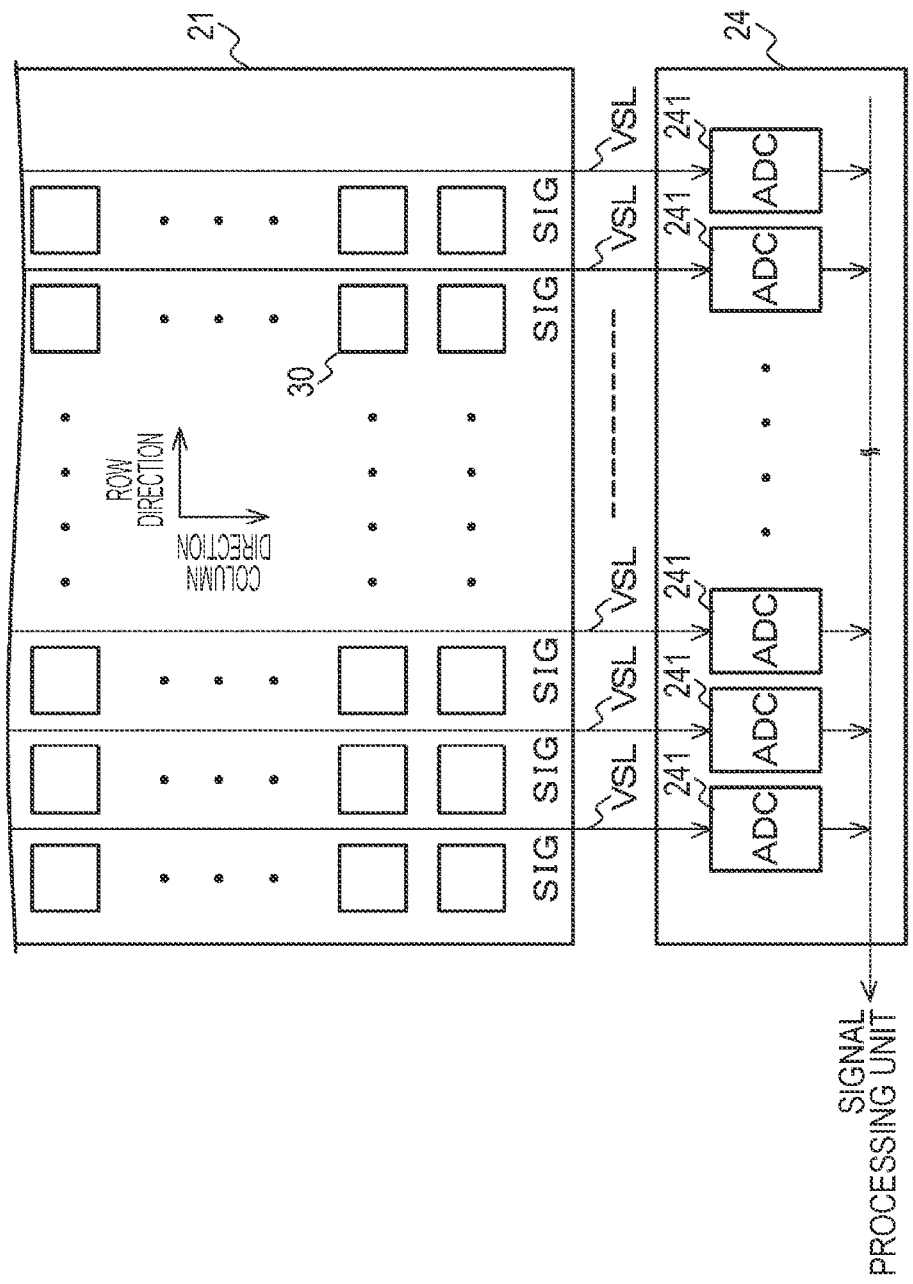
FIG. 7 is a block diagram illustrating an example of a configuration of a column processing unit.

The pixel array unit 21 includes the plurality of pixels 30. The plurality of pixels 30 outputs an output signal in response to the selection signal of the read area selection unit 27. Each of the plurality of pixels 30 may have a quantizer in the pixel as illustrated in FIG. 7, for example. The plurality of pixels 30 outputs an output signal corresponding to the change amount in the intensity of light. The plurality of pixels 30 may be two-dimensionally arranged in a matrix as illustrated in FIG. 5.

The drive unit 22 drives each of the plurality of pixels 30 to output the pixel signal generated in each pixel 30 to the signal processing unit 25. Note that the drive unit 22 and the signal processing unit 25 are circuit units for acquiring gradation information. Therefore, in a case where only the event information is acquired, the drive unit 22 and the signal processing unit 25 do not have to be provided.

The read area selection unit 27 selects some of the plurality of pixels 30 included in the pixel array unit 21. For example, the read area selection unit 27 selects any one or a plurality of rows among the rows included in the structure of the two-dimensional matrix corresponding to the pixel array unit 21. The read area selection unit 27 sequentially selects one or a plurality of rows according to a preset cycle. Furthermore, the read area selection unit 27 may determine the selection area in response to a request from each pixel 30 of the pixel array unit 21.

On the basis of the output signal of the pixel selected by the read area selection unit 27, the signal generation unit 28 generates an event signal corresponding to the active pixel in which the event has been detected among the selected pixels. The event is an event in which the intensity of light changes. The active pixel is a pixel in which the change amount in the intensity of light corresponding to the output signal exceeds or falls below a preset threshold value. For example, the signal generation unit 28 compares the output signal of the pixel with a reference signal, detects an active pixel that outputs the output signal in a case where the output signal is larger or smaller than the reference signal, and generates an event signal corresponding to the active pixel.

The signal generation unit 28 can include, for example, a column selection circuit that arbitrates a signal entering the signal generation unit 28. Furthermore, the signal generation unit 28 can be configured to output not only the information of the active pixel that has detected the event but also the information of the inactive pixel that has not detected the event.

The address information and the time stamp information (for example, (X, Y, T)) of the active pixel in which the event has been detected are output from the signal generation unit 28 through an output line 15. However, the data output from the signal generation unit 28 may be not only the address information and the time stamp information but also information in a frame format (for example, (0, 0, 1, 0, . . . )).

[Configuration Example of Chip Structure]

Figure 6:
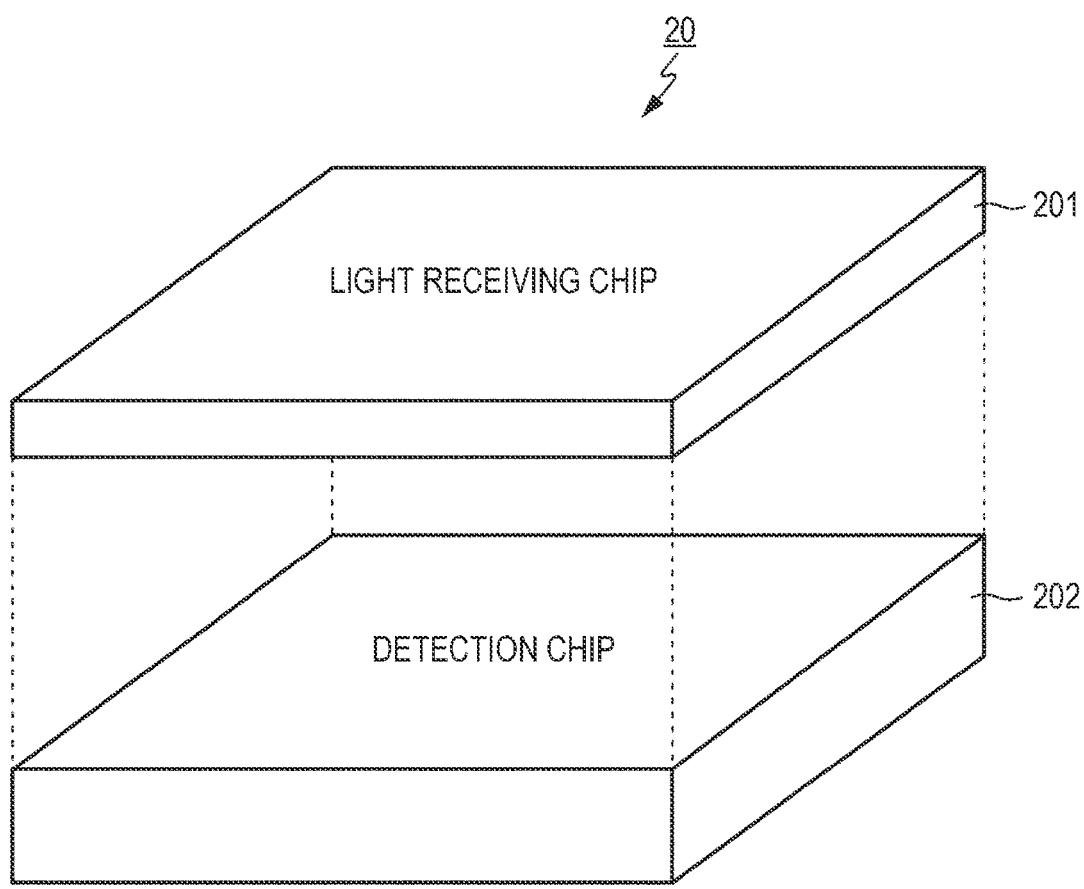
FIG. 6 is an exploded perspective diagram schematically illustrating a laminated chip structure of the imaging device.

As a chip (semiconductor integrated circuit) structure of the imaging device 20 according to the first configuration example or the second configuration example described above, for example, a laminated chip structure can be adopted. FIG. 6 is an exploded perspective diagram schematically illustrating a laminated chip structure of the imaging device 20.

As illustrated in FIG. 6, the laminated chip structure, that is the laminated structure has a structure in which at least two chips of a light receiving chip 201 as a first chip and a detection chip 202 as a second chip are laminated. Then, in the circuit configuration of the pixel 30 illustrated in FIG. 4, each of the light receiving element 311 is arranged on the light receiving chip 201, and all elements other than the light receiving element 311, elements of other circuit portions of the pixel 30, and the like are arranged on the detection chip 202. The light receiving chip 201 and the detection chip 202 are electrically connected via a connection portion such as a via (VIA), Cu—Cu bonding, or a bump. That is the light receiving chip 201 and the detection chip 202 are bonded to each other by any of a chip on chip (CoC) method, a chip on wafer (CoW) method, and a wafer on wafer (WoW) method.

Note that, here, a configuration example in which the light receiving element 311 is arranged on the light receiving chip 201, and elements other than the light receiving element 311, elements of other circuit portions of the pixel 30, and the like are arranged on the detection chip 202 has been exemplified, but the present technology is not limited to this configuration example.

For example, in the circuit configuration of the pixel 30 illustrated in FIG. 4, each element of the light receiving unit 31 may be arranged on the light receiving chip 201, and elements other than the light receiving unit 31, elements of other circuit portions of the pixel 30, and the like may be arranged on the detection chip 202. Furthermore, each element of the light receiving unit 31, and the reset transistor 321 and the floating diffusion layer 324 of the pixel signal generation unit 32 may be arranged on the light receiving chip 201, and the other elements may be arranged on the detection chip 202. Furthermore, a part of the elements constituting the address event detection unit 33 may be arranged on the light receiving chip 201 together with each element of the light receiving unit 31 and the like.

[Configuration Example Pf Column Processing Unit]

FIG. 7 is a block diagram illustrating an example of a configuration of the column processing unit 24 of the imaging device 20 according to the first configuration example. As illustrated in FIG. 7, the column processing unit 24 according to the present example includes a plurality of analog-digital converters (ADC) 241 arranged for each pixel column of the pixel array unit 21.

Note that, here, a configuration example in which the analog-digital converter 241 is arranged in a one-to-one correspondence relationship with respect to the pixel column of the pixel array unit 21 has been exemplified, but the present technology is not limited to this configuration example. For example, the analog-digital converter 241 may be arranged in units of a plurality of pixel columns, and the analog-digital converter 241 may be used in a time division manner between the plurality of pixel columns.

The analog-digital converter 241 converts the analog pixel signal SIG supplied via the vertical signal line VSL into a digital signal having a larger bit depth than the detection signal of the address event described above. For example, when the detection signal of the address event is 2 bits, the pixel signal is converted into a digital signal of 3 bits or more (16 bits and the like). The analog-digital converter 241 supplies the digital signal generated by the analog-digital conversion to the signal processing unit 25.

Figure 8:
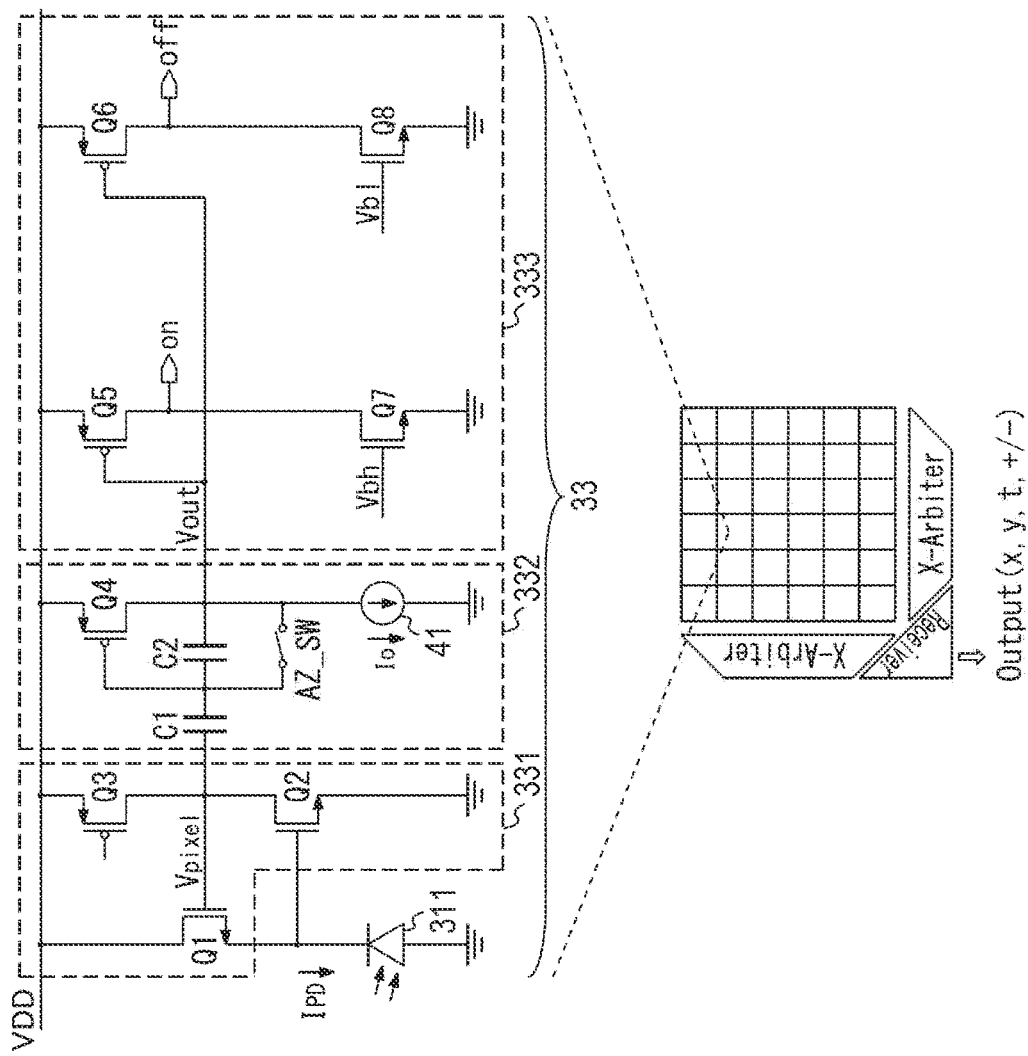
FIG. 8 is a circuit diagram illustrating a basic configuration of an address event detection unit.

FIG. 8 is a circuit diagram illustrating a basic configuration of the address event detection unit 33. First, the operation of the address event detection unit 33 will be described with reference to FIG. 8. As illustrated in the lower side of FIG. 8, the address event detection unit 33 of FIG. 8 is provided for each pixel in the pixel array unit 21.

The address event detection unit 33 in FIG. 8 includes a current-voltage conversion unit 331, a reset circuit 332, and an event detection circuit 333.

The current-voltage conversion unit 331 includes NMOS transistors Q1 and Q2 and a PMOS transistor Q3. The source of the transistor Q1 is connected to the cathode of the light receiving element 311, the drain is connected to a power supply voltage node VDD, and the gate is connected to one end of a capacitor C1. The transistors Q3 and Q2 are cascode-connected between the power supply voltage node VDD and the ground node. The gate of the transistor Q2 is connected to the cathode of the light receiving element 311.

Each of the transistors Q1 and Q2 and the transistors Q1 and Q3 constitutes a source follower, and the photocurrent from the light receiving element 311 is converted into a logarithmic voltage signal by the two source followers connected in a loop shape.

The reset circuit 332 includes a PMOS transistor Q4, capacitors C1 and C2, a current source 41, and a switch AZ_SW. The capacitors C1 and C2 are cascade-connected between the output node of the current-voltage conversion unit 331, that is the gate of the transistor Q1 and the drain of the transistor Q4. The switch AZ_SW is connected between the gate and the drain of the transistor Q4. A current source is connected between the drain of the transistor Q4 and the ground node. In FIG. 8, the drain voltage of the transistor Q4 is Vout.

The event detection circuit 333 includes PMOS transistors Q5 and Q6 and NMOS transistors Q7 and Q8. The gates of the transistors Q5 and Q6 are connected to the drain of the transistor Q4, and its voltage is Vout. The transistors Q5 and Q7 are cascode-connected between the power supply voltage node VDD and the ground node. The transistors Q6 and Q8 are cascode-connected between the power supply voltage node VDD and the ground node. Both drains of the transistors Q5 and Q7 are connected to the On output node. A threshold value voltage Vbh is input to the gate of the transistor Q7. A threshold value voltage Vbl is input to the gate of the transistor Q8. Each of the transistors Q7 and Q8 functions as a current source.

Both drains of the transistors Q6 and Q8 are connected to the Off output node. The On output node is a node that outputs the event signal Von at the "1" level when the change amount in the direction in which the luminance signal increases exceeds the threshold value. The Off output node is a node that outputs an event signal Voff at the "0" level when the change amount in the direction in which the luminance signal decreases exceeds the threshold value.

Figures 9, 10:
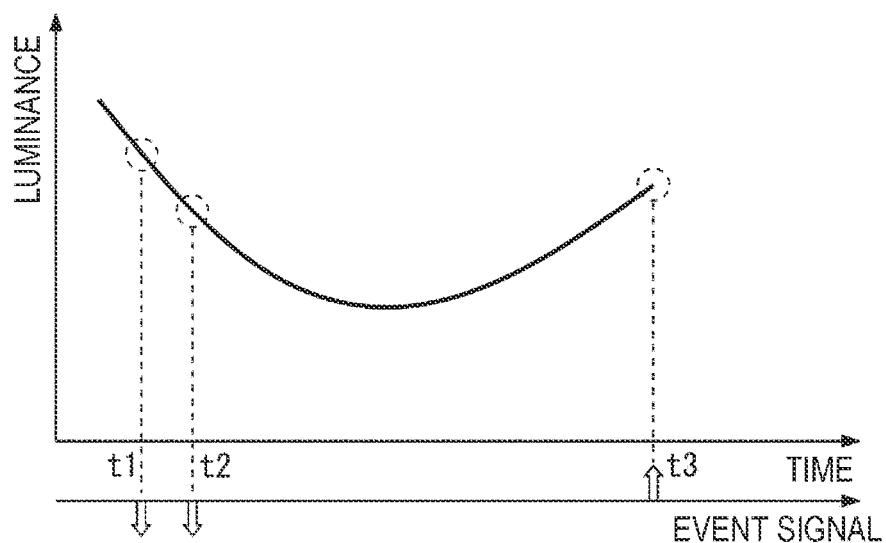
FIG. 9 is a diagram illustrating a luminance change around the imaging device.
FIG. 10 is a diagram illustrating a truth value table of event signals Von and Voff.

FIG. 9 is a diagram illustrating a luminance change around the imaging device 20. In FIG. 9, the horizontal axis represents time, and the vertical axis represents a luminance value. The address event detection unit 33 in FIG. 8 outputs an event signal when the luminance change amount exceeds a predetermined threshold value. In FIG. 9, the timing at which the event signal is output is indicated by a circle. In the example of FIG. 8, at times t1 and t2, an event signal is output because the change amount in the direction in which the luminance decreases exceeds the threshold value. Furthermore, at time t3, an event signal is output because the change amount in the direction in which the luminance increases exceeds the threshold value.

FIG. 10 is a diagram illustrating a truth value table of the event signals Von and Voff output from the On output node and the Off output node. As illustrated, in the event signal in a state where no event has occurred, the signal Von of the On output node is "0" and the signal Voff of the Off output node is "1". In a case where the luminance signal changes in the increasing direction, the gate voltage Vout of the transistor Q5 in FIG. 8 changes, and in a case where a current drive capability Io between the source and the drain of the transistors Q5 and Q6 exceeds current threshold values Ioh and Iol given by the threshold value voltages Vbh and Vbl, the signal Von of the On output node becomes "1" and the signal Voff of the Off output node becomes "1". In a case where the luminance signal changes in the decreasing direction, the gate voltage Vout of the transistors Q5 and Q6 in FIG. 8 changes, and in a case where the current drive capability Io between the source and the drain of the transistors Q5 and Q6 falls below the current threshold values Ioh and Iol given by the threshold value voltages Vbh and Vbl, the signal Von of the On output node becomes "0" and the signal Voff of the Off output node becomes "0".

Figure 11A:
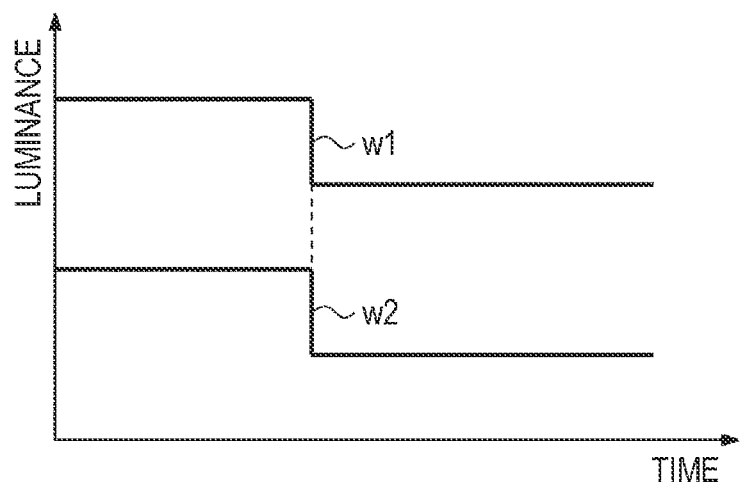
FIG. 11A is a waveform diagram illustrating a luminance change around the imaging device.
Figure 11B:
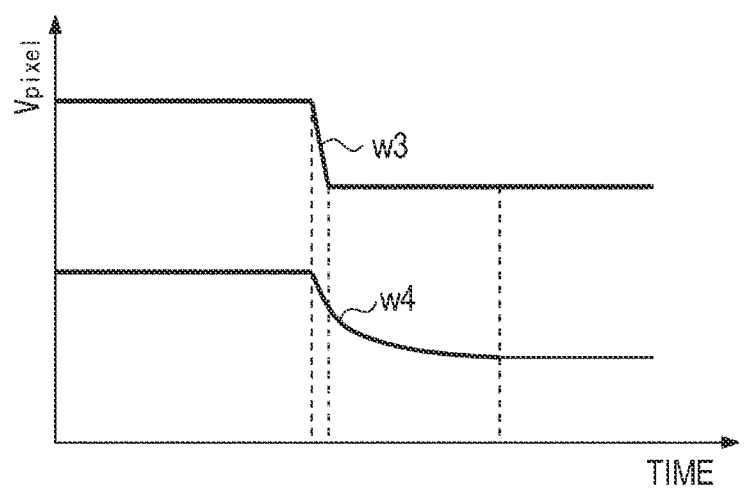
FIG. 11B is a waveform diagram illustrating a voltage change of an output voltage of the current-voltage conversion unit in FIG. 8.

Once an event occurs, the switch AZ_SW in the reset circuit 332 is turned on and enters a reset state. Therefore, the signal Von of the On output node becomes "0", and the signal Voff of the Off output node becomes FIG. 11A is a waveform diagram illustrating a luminance change around the imaging device 20, and FIG. 11B is a waveform diagram illustrating a voltage change of an output voltage Vpixel of the current-voltage conversion unit 331 in FIG. 8. Hereinafter, the pixel output voltage Vpixel is referred to as a pixel output voltage. A waveform w1 in FIG. 11A indicates a temporal change of the luminance value in a case where the luminance suddenly decreases in a situation where the luminance is bright (hereinafter, also referred to as bright time), and a waveform w2 indicates a temporal change of the luminance value in a case where the luminance suddenly decreases in a dark situation (hereinafter, also referred to as dark time). A waveform w3 in FIG. 11B indicates a temporal change of the pixel output value Vpixel corresponding to the luminance value of the waveform w1, and a waveform w4 indicates a temporal change of the pixel output value Vpixel corresponding to the luminance value of the waveform w2. The horizontal axis in FIGS. 11A and 11B represents time, the vertical axis in FIG. 11A represents a luminance value, and the vertical axis in FIG. 11B represents a voltage.

As illustrated in FIG. 11B, when the luminance decreases under a bright situation, the pixel output voltage Vpixel changes steeply. On the other hand, when the luminance decreases in a dark time state, the pixel output voltage Vpixel gradually decreases over time. This is because, under a dark situation, the current flowing through the light receiving element 311 is minute, and the charge accumulation time of the parasitic capacitance in the circuit of FIG. 8 becomes long. Thus, the time until the event signal is output becomes long, and the response characteristics deteriorate. As described later, the present embodiment is characterized in that responsiveness at dark time is improved, but first, a basic operation of the address detection unit in FIG. 8 will be described.

Figure 12:
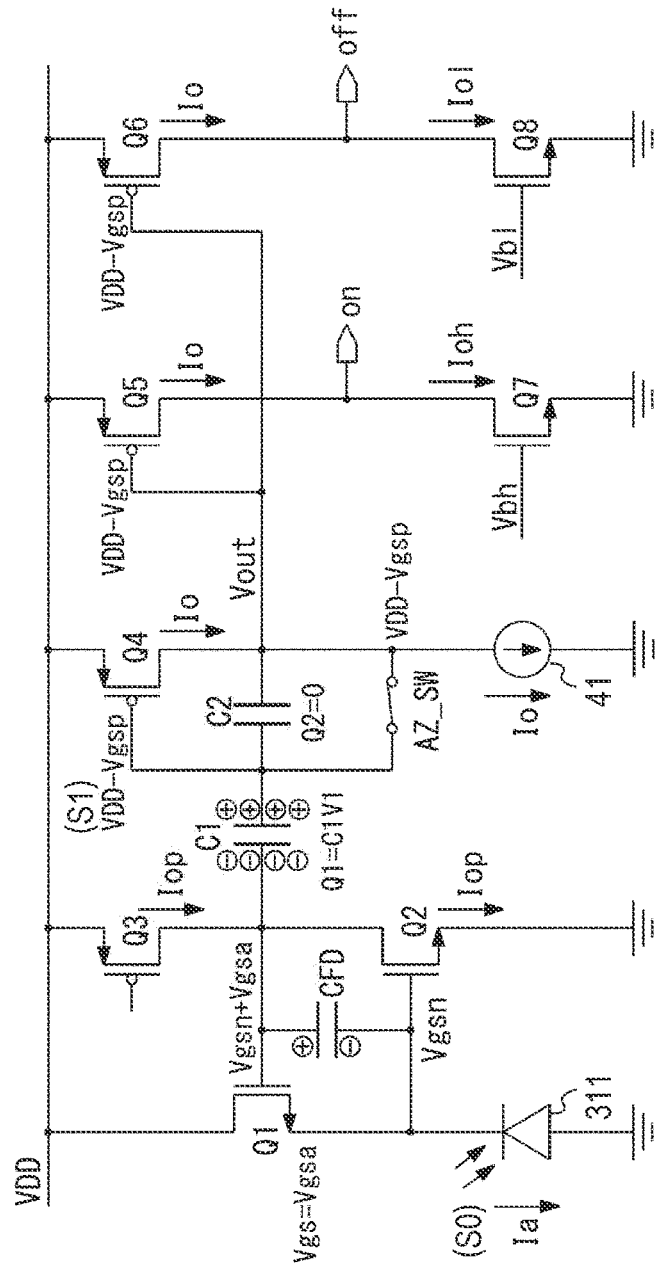
FIG. 12 is a diagram sequentially illustrating a reset operation by a reset circuit in the address event detection unit.
Figure 13:
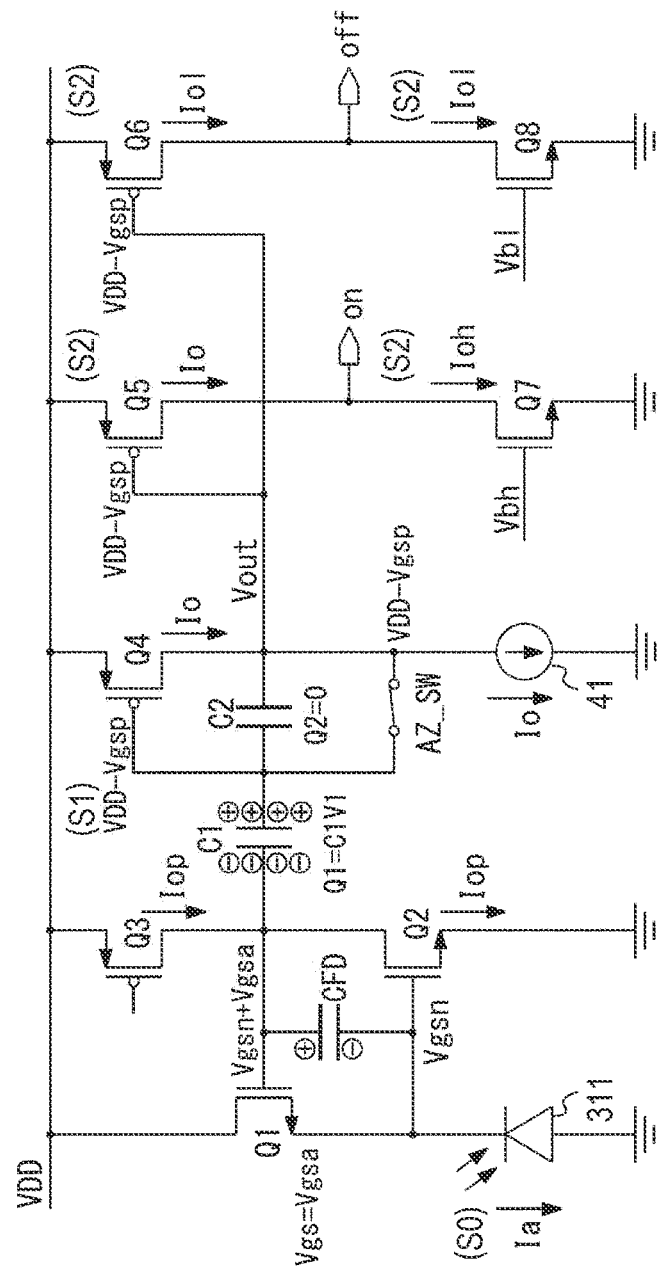
FIG. 13 is a diagram following FIG. 12.
Figure 14:
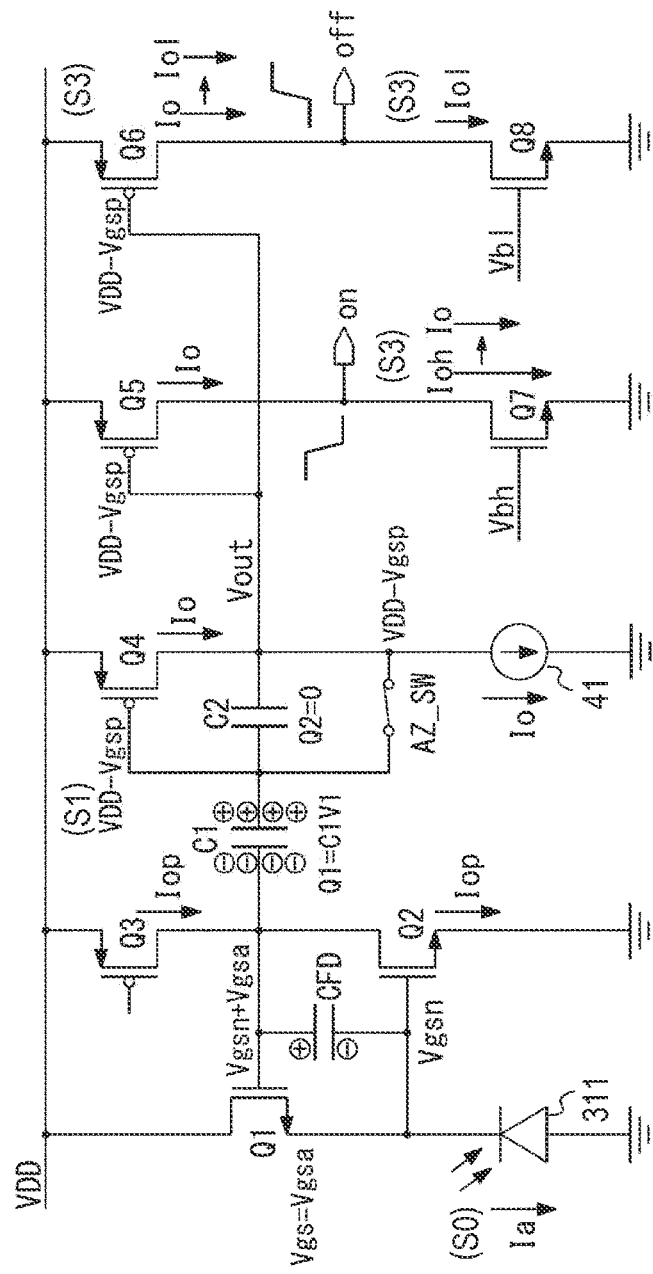
FIG. 14 is a diagram following FIG. 13.

FIGS. 12 to 14 are diagrams sequentially illustrating a reset operation by the reset circuit 332 in the address event detection unit 33. In FIGS. 12 to 14, the order in which each node in the address event detection unit 33 operate is represented by S0 to S3.

As illustrated in FIG. 12, it is assumed that a current Ia flows through the light receiving element 311 (S0). When the switch AZ_SW in the reset circuit 332 is turned on, the gate and the drain of the transistor Q4 have the same potential, in a manner that the accumulated charge of the capacitor C2 becomes 0 (S1). In FIG. 12, the gate voltage (drain voltage) of the transistor Q4 is VDD−Vgsp. Furthermore, in FIG. 12, the gate voltage of the transistor Q2 is Vgsn, and the voltage applied to a capacitance CFD between the each gate of the transistors Q1 and Q2 is Vgsa. Therefore, the gate voltage of the transistor Q1 becomes VgsnVgsa. The charge accumulated in the capacitance CFD is QFD=CFD×Vgsa. The accumulated charge of the capacitor C1 is Q1=C1×V1. Note that V1=VDD−Vgap−Vgsn−Vgsa.

The gate voltages of the transistors Q5 and Q6 are VDD−Vgsp, and at this time, a current flowing between the source and the drain of the transistor Q4 in the reset circuit 332 is Io (S2). As illustrated in FIG. 13, gate voltages Vbh and Vbl are set in a manner that the currents Ioh and Iol flow between the drain and the source of the transistors Q7 and Q8, respectively. At this time, Ioh>Io>Iol.

From the state of FIG. 13, as illustrated in FIG. 14, each drain-source current of the transistors Q5 and Q7 is balanced, and each drain-source current of the transistors Q6 and Q8 is balanced (S3). Therefore, the drain-source current of the transistor Q7 changes from Ioh to Io, and the source-drain current of the transistor Q6 changes from Io to Iol. Furthermore, the voltage of the On output node decreases, and the voltage of the Off output node increases. Therefore, in a state where no event has occurred, the On output node becomes "0" and the Off output node becomes "1".

FIGS. 15 to 23 are diagrams for explaining a comparison operation in the address event detection unit 33 as to whether or not an event has occurred. In FIGS. 15 to 23, the order in which each node in the address event detection unit 33 operate is represented by S21 to S34.

Figure 15:
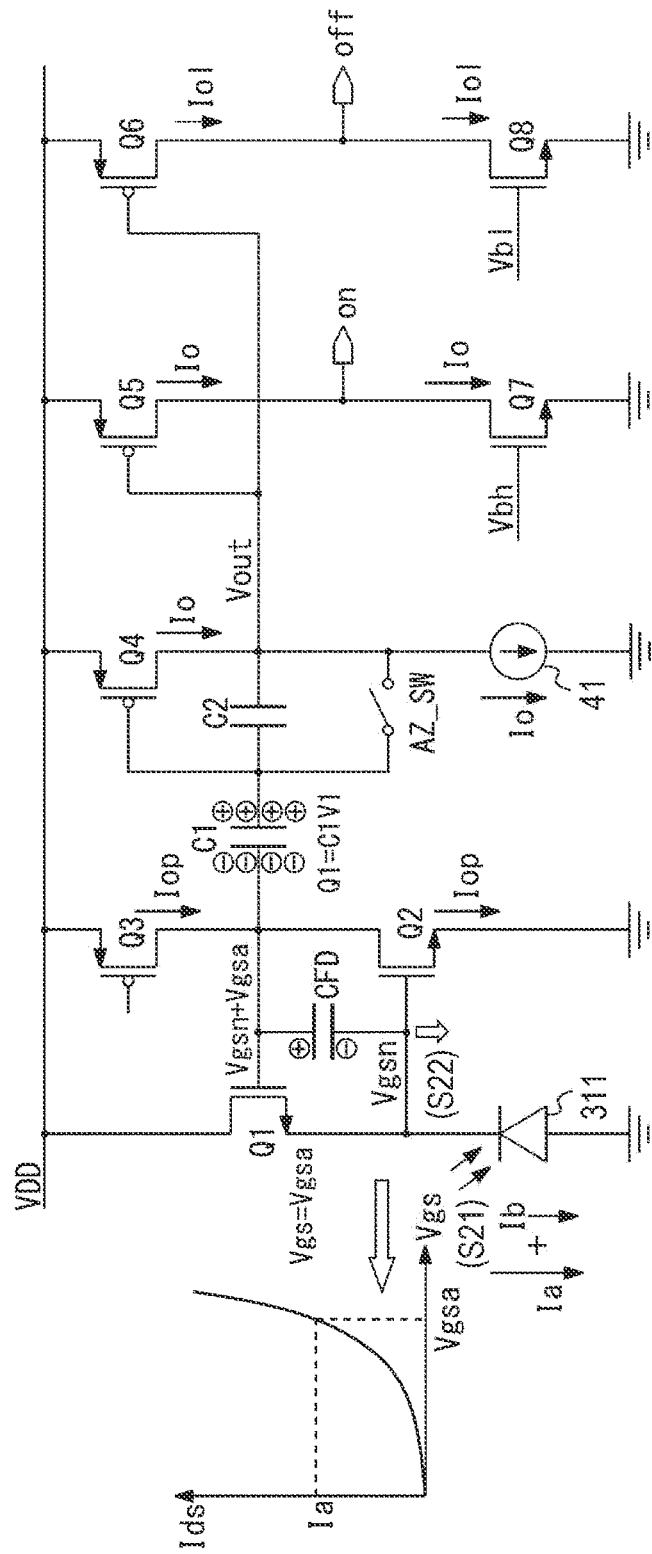
FIG. 15 is a diagram for explaining a comparison operation in the address event detection unit.

When the amount of light incident on the light receiving element 311 increases, the current flowing through the light receiving element 311 increases (S21). Here, an example in which the initial current is Ia and the current increases from the initial current Ia by Ib will be described. The relationship between the current flowing through the light receiving element 311 and the source voltage of the transistor Q1 is represented by a graph illustrated on the left side of FIG. 15. As illustrated in FIG. 15, when the gate-source voltage of the transistor Q1 increases, the current flowing through the light receiving element 311 rapidly increases.

Figure 16:
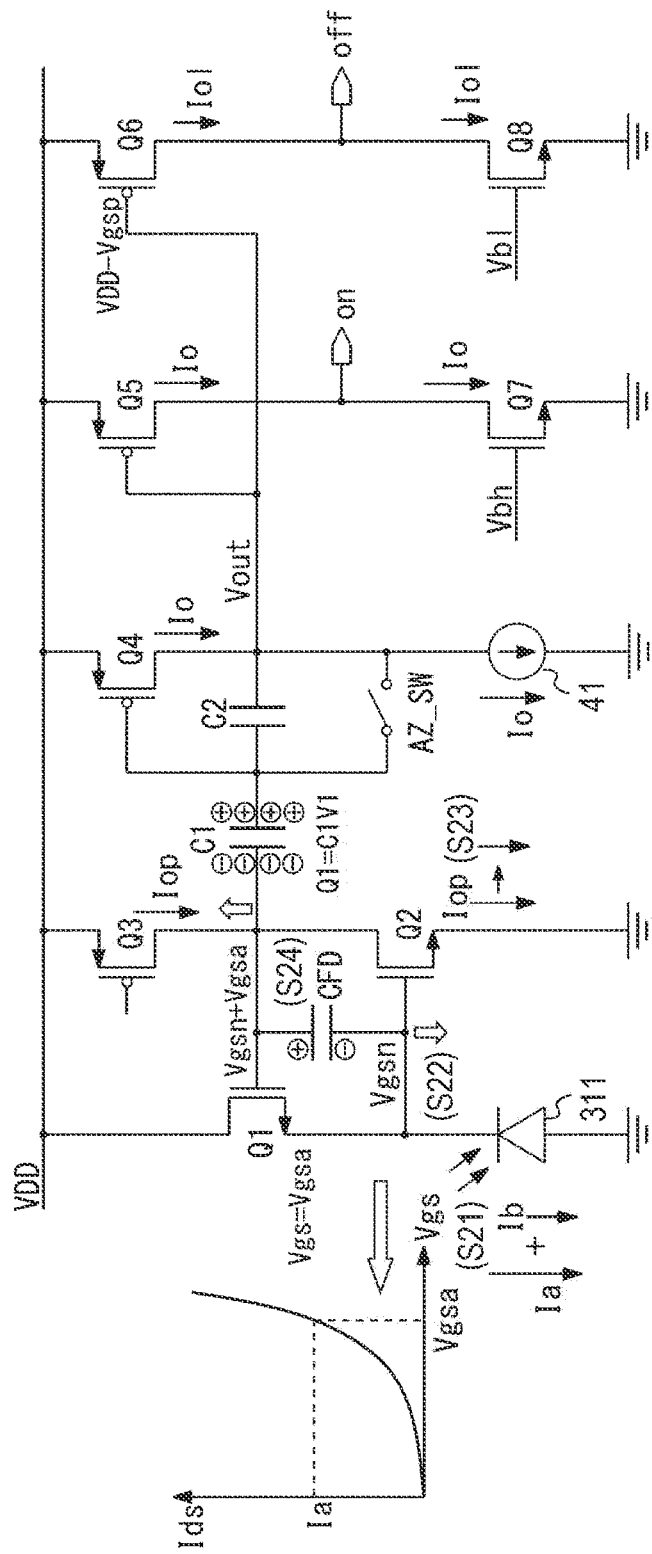
FIG. 16 is a diagram following FIG. 15.

When the current flowing through the light receiving element 311 increases, the gate voltage of the transistor Q2 decreases (S22). Therefore, the drain-source current of the transistor Q2 decreases (S23). At this time, as illustrated in FIG. 16, since a drain-source current Iop of the transistor Q3 does not change, the current corresponding to the decrease in the drain-source current of the transistor Q2 flows through the capacitor CFD to accumulate charges, and the pixel output voltage Vpixel rises (step S24).

Figure 17:
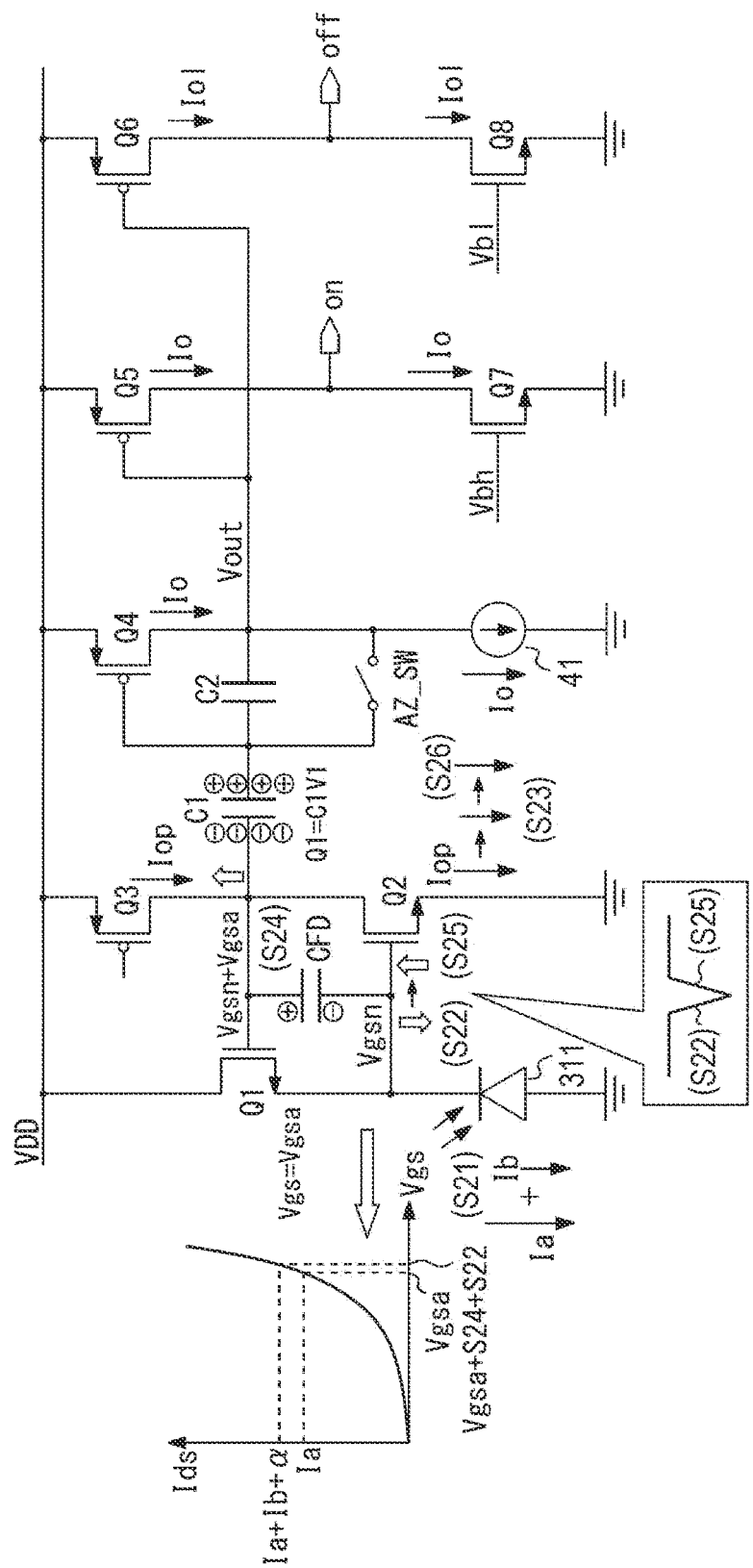
FIG. 17 is a diagram following FIG. 16.

As illustrated in FIG. 17, due to the increase in the pixel output voltage Vpixel, a gate-source voltage Vgs of the transistor Q1 increases, the drain-source current of the transistor Q1 becomes Ia+Ib+α (see the graph on the left side of FIG. 17), and the drain-source current of the transistor Q1 causes ringing to increase or decrease. When the pixel output voltage Vpixel input to the gate of the transistor Q1 increases, the gate voltage of the transistor Q2 also increases (S25). Therefore, the drain-source current of the transistor Q2 returns to the original Iop (S26).

Figure 18:
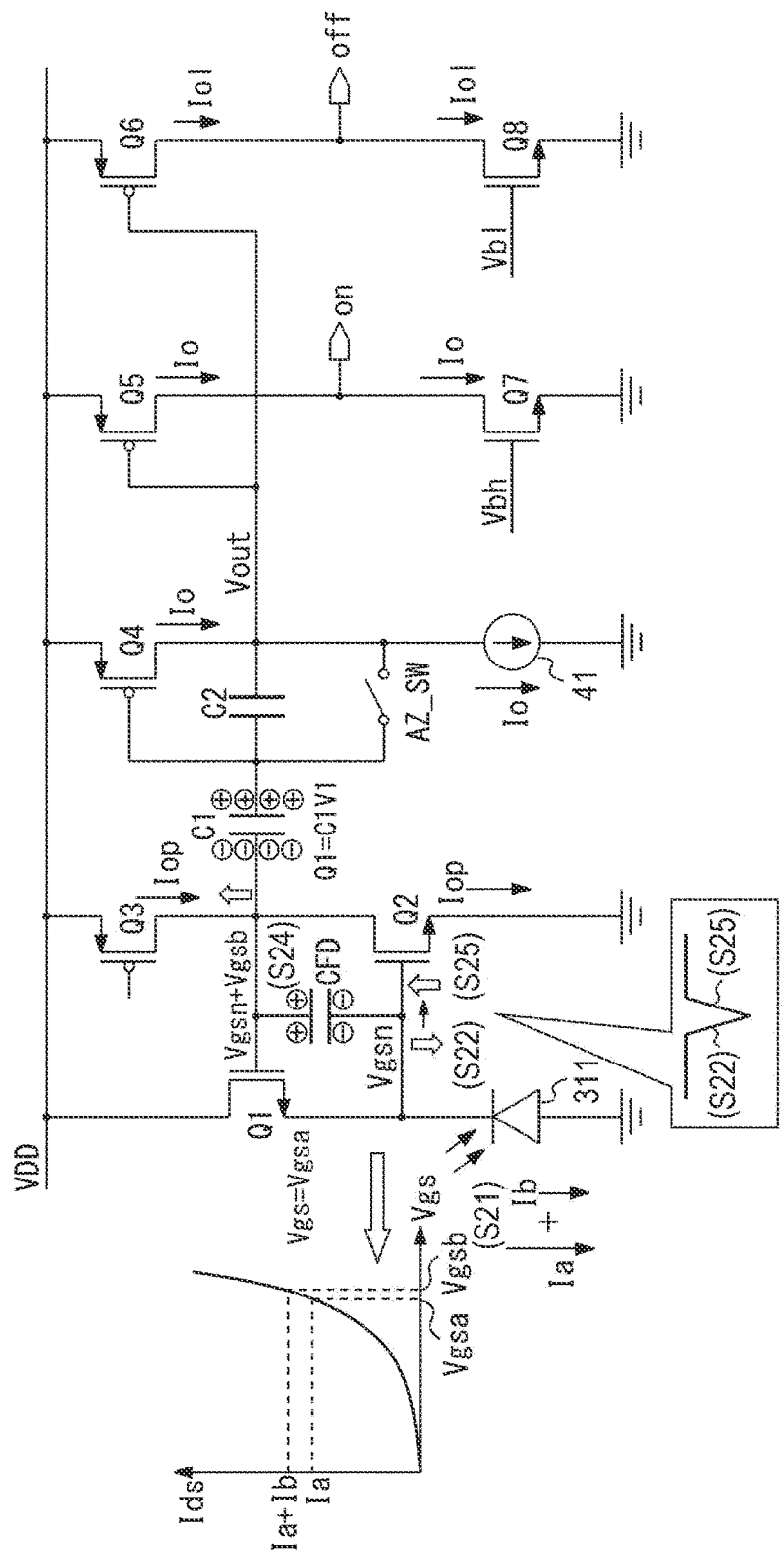
FIG. 18 is a diagram following FIG. 17.

As illustrated in FIG. 18, the gate-source voltage Vgs of the transistor Q1 is stabilized by the above-described operations of S25 to S26, and the current Ia+Ib flows through the light receiving element 311 (S27).

Figure 19:
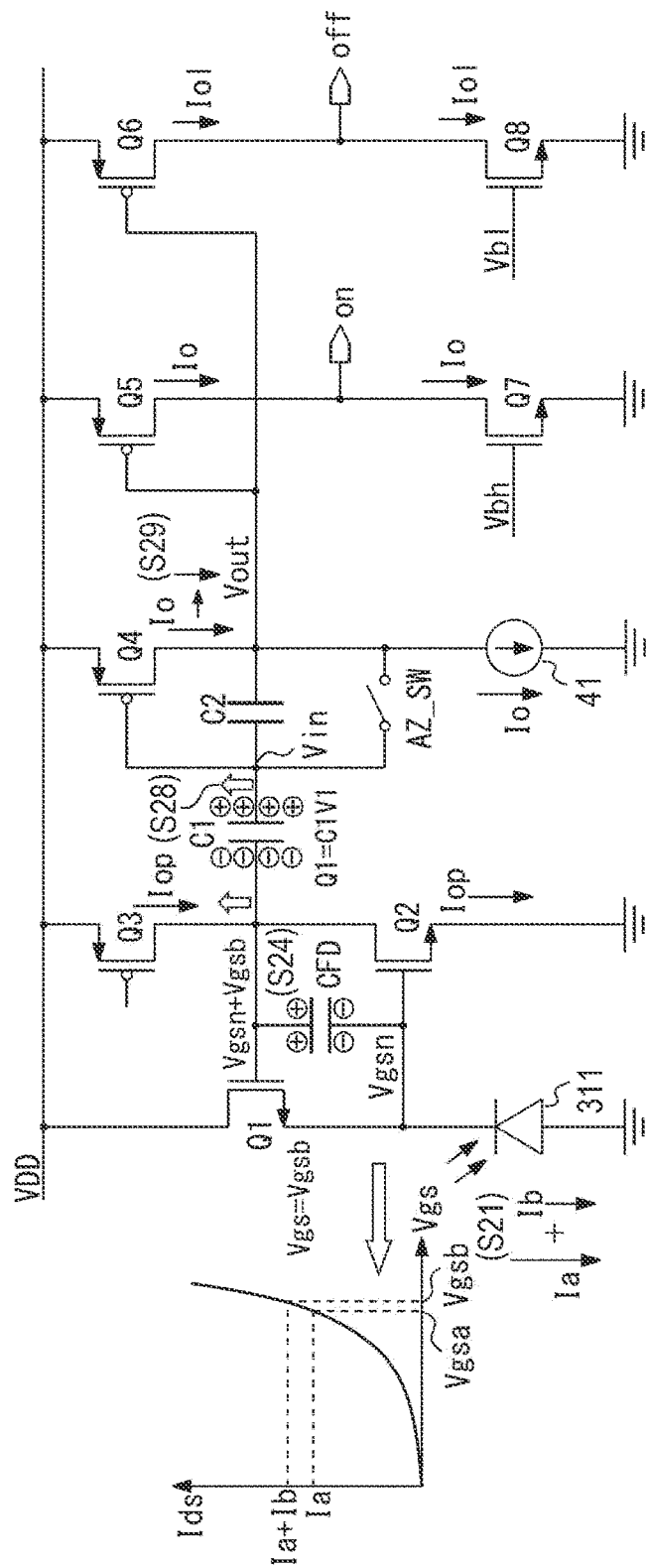
FIG. 19 is a diagram following FIG. 18.

Therefore, as illustrated in FIG. 19, a voltage Vin at the connection node of the capacitors C1 and C2 increases (S28), and the source-drain current of the transistor Q4 decreases (S29).

Figure 20:
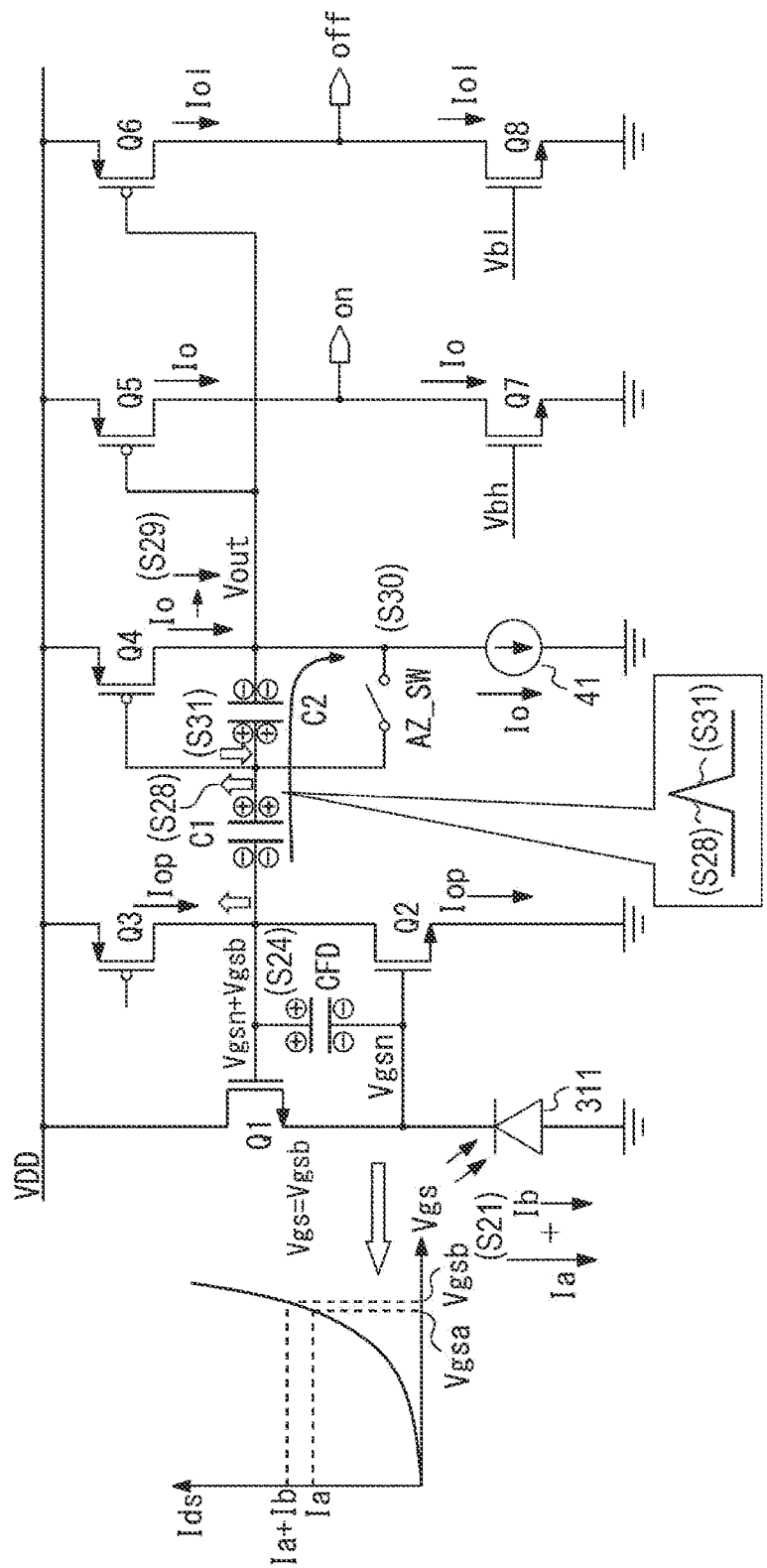
FIG. 20 is a diagram following FIG. 19.

At this time, since the drain-source current of the transistor Q2 is constant, as illustrated in FIG. 20, the current flowing through the capacitors C1 and C2 increases, and a part of the accumulated charge of the capacitor C1 moves to the capacitor C2 (S30). Therefore, the voltage Vin at the connection node of the capacitors C1 and C2 returns to the voltage before S28 (S31).

Figure 21:
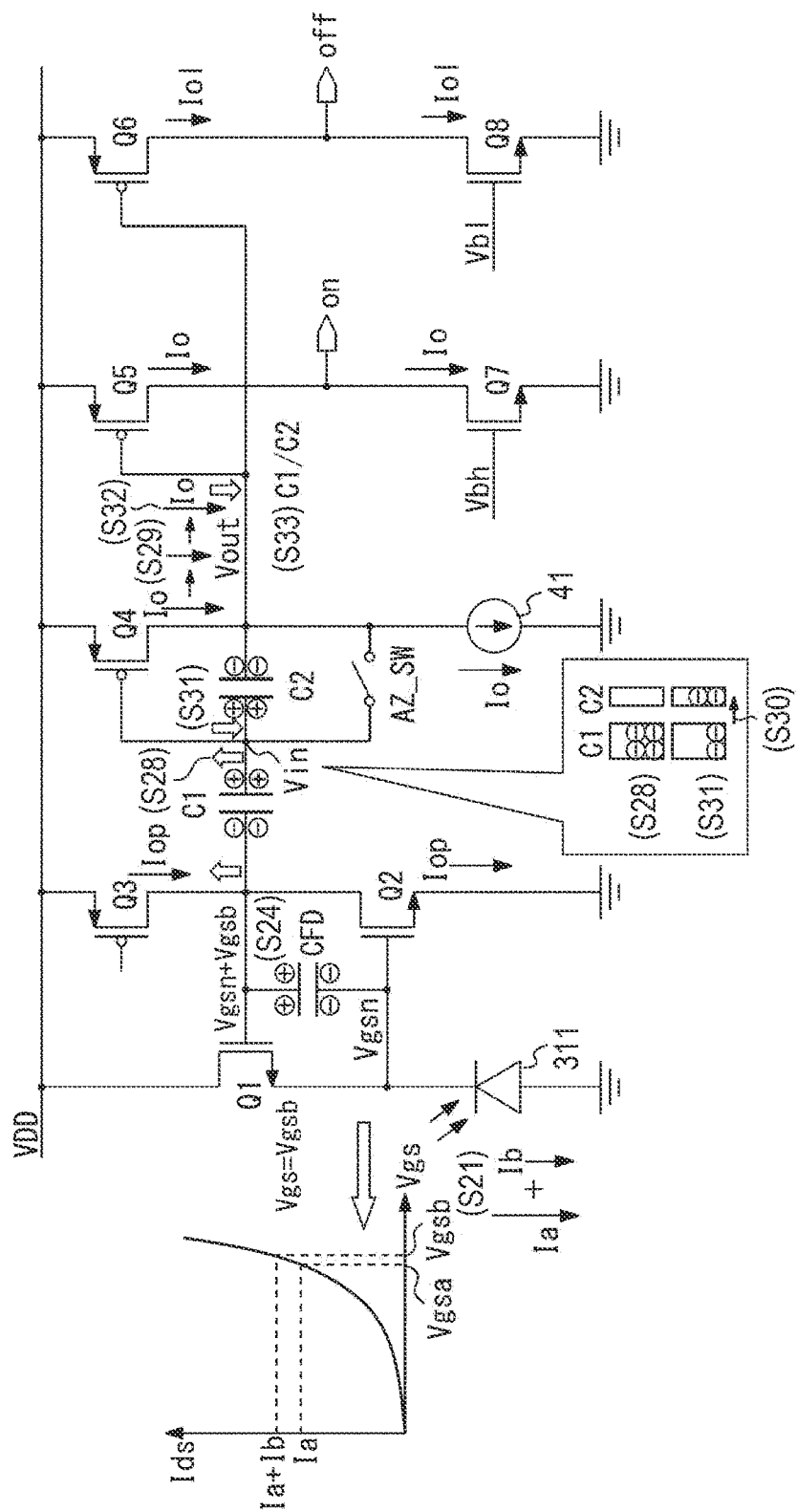
FIG. 21 is a diagram following FIG. 20.

As the voltage Vin at the connection node of the capacitors C1 and C2 decreases, the source-drain current of the transistor Q4 returns to Io as illustrated in FIG. 21 (S32). By the movement of the accumulated charge in S30, the voltage Vout decreases according to the capacitance ratio between the capacitors C1 and C2 (S33).

Figure 22:
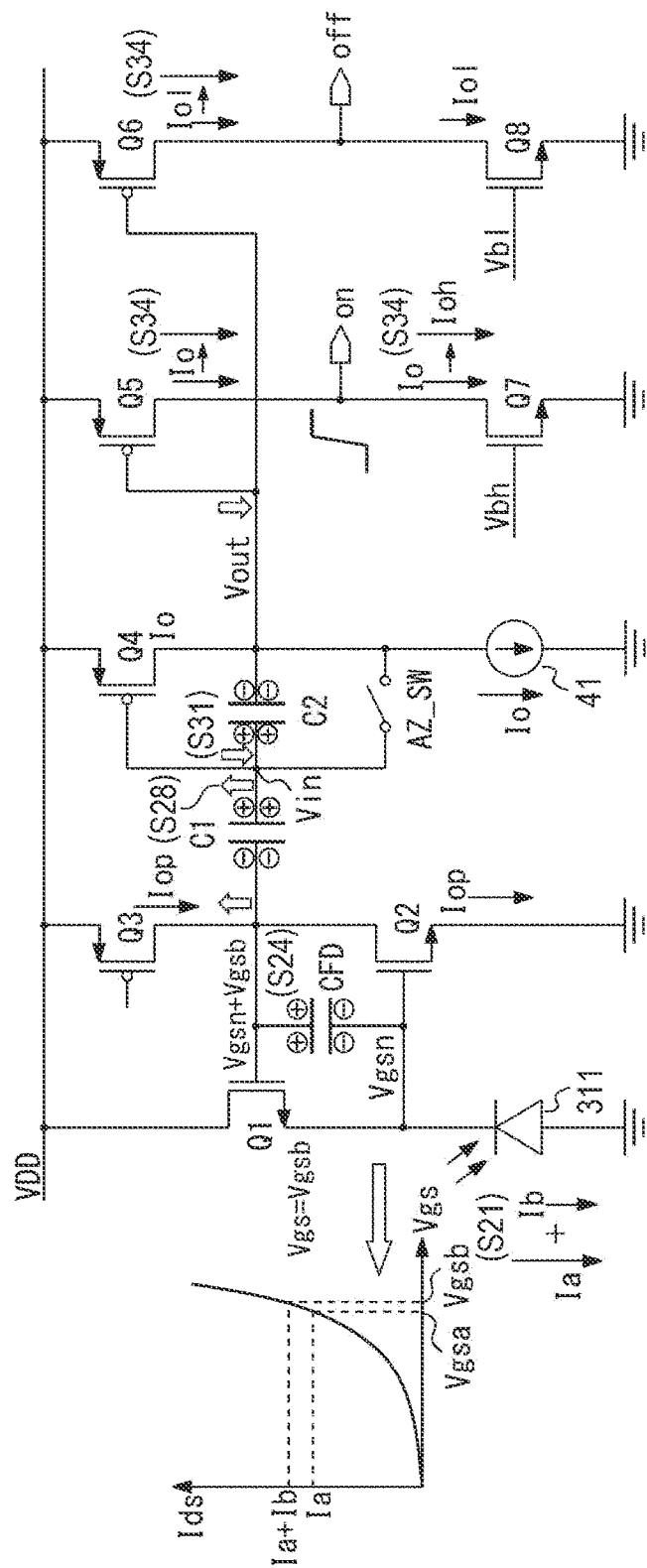
FIG. 22 is a diagram following FIG. 21.

Therefore, as illustrated in FIG. 22, the source-drain current of the transistor Q5 increases (S34). On the other hand, since the drain-source current of the transistor Q8 does not increase to Iol or more, the voltage Voff of the Off output node increases. Since there is room for the drain-source current of the transistor Q7 to increase to Ioh on the On side, the behavior of a voltage Von of the On output node changes due to the fluctuation amount of the source-drain current of the transistor Q5. When the source-drain current of the transistor Q5 is less than Ioh, the voltage Von does not fluctuate. When the current drive capability between the source and the drain of the transistor Q5 is Ioh or more, the voltage Von increases.

Figure 23:
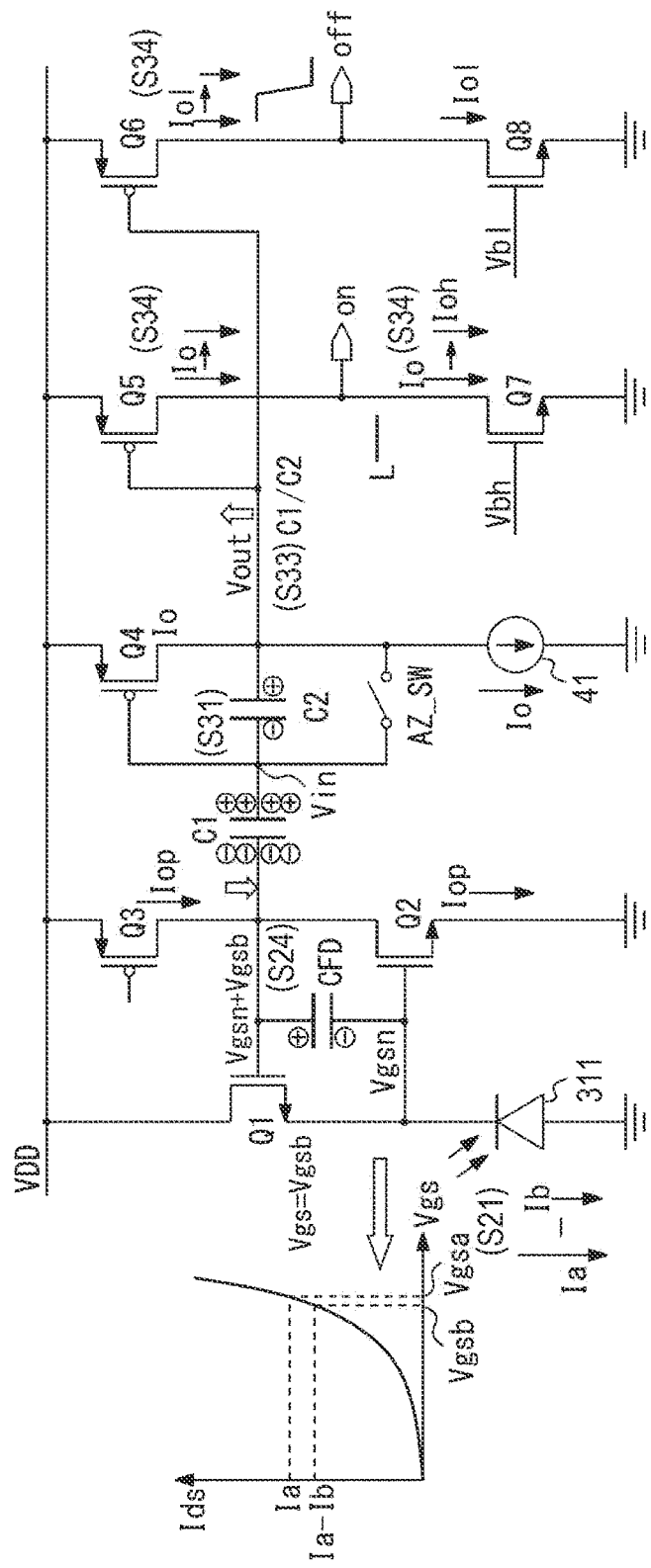
FIG. 23 is a diagram following FIG. 22.

On the other hand, when the luminance around the imaging device 20 decreases, as illustrated in FIG. 23, the voltage Vout increases due to the above-described S33, and the source-drain current of the transistor Q5 decreases (s34). Von of the drain-source current of the transistor Q7 connected to the On output node decreases to be equal to the source-drain current of the transistor Q5. Since there is room for the source-drain current of the transistor Q6 connected to the Off output node to decrease to Iol, the behavior of the voltage Voff changes depending on the fluctuation amount of the source-drain current of the transistor Q6. In a case where the source-drain current of the transistor Q6 is larger than Iol, the voltage Voff does not change. In a case where the source-drain current of the transistor Q6 is Iol or less, the voltage Voff decreases.

As described above, due to the luminance change around the imaging device 20, the event signal Von output from the On output node and the event signal Voff output from the Off output node have logic as illustrated in FIG. 10. "1" in FIG. 10 means that the potential increases, and "0" means that the potential decreases.

As illustrated in FIG. 11B, in the circuit configuration of the analog event detection unit 33 in FIG. 8, since the pixel output voltage Vpixel gently changes at dark time, the timing of event detection is delayed, and responsiveness is deteriorated. In order to improve the responsiveness at dark time, it is conceivable to reduce the voltage difference between the threshold value voltages Vbh and Vbl input to the gates of the transistors Q7 and Q8 in FIG. 8, but in such a case, noise is included in the event detection at bright time, and the reliability deteriorates. Therefore, the analog event detection unit 33 according to the present embodiment improves the responsiveness at dark time without deteriorating the reliability of event detection at bright time.

Figure 24:
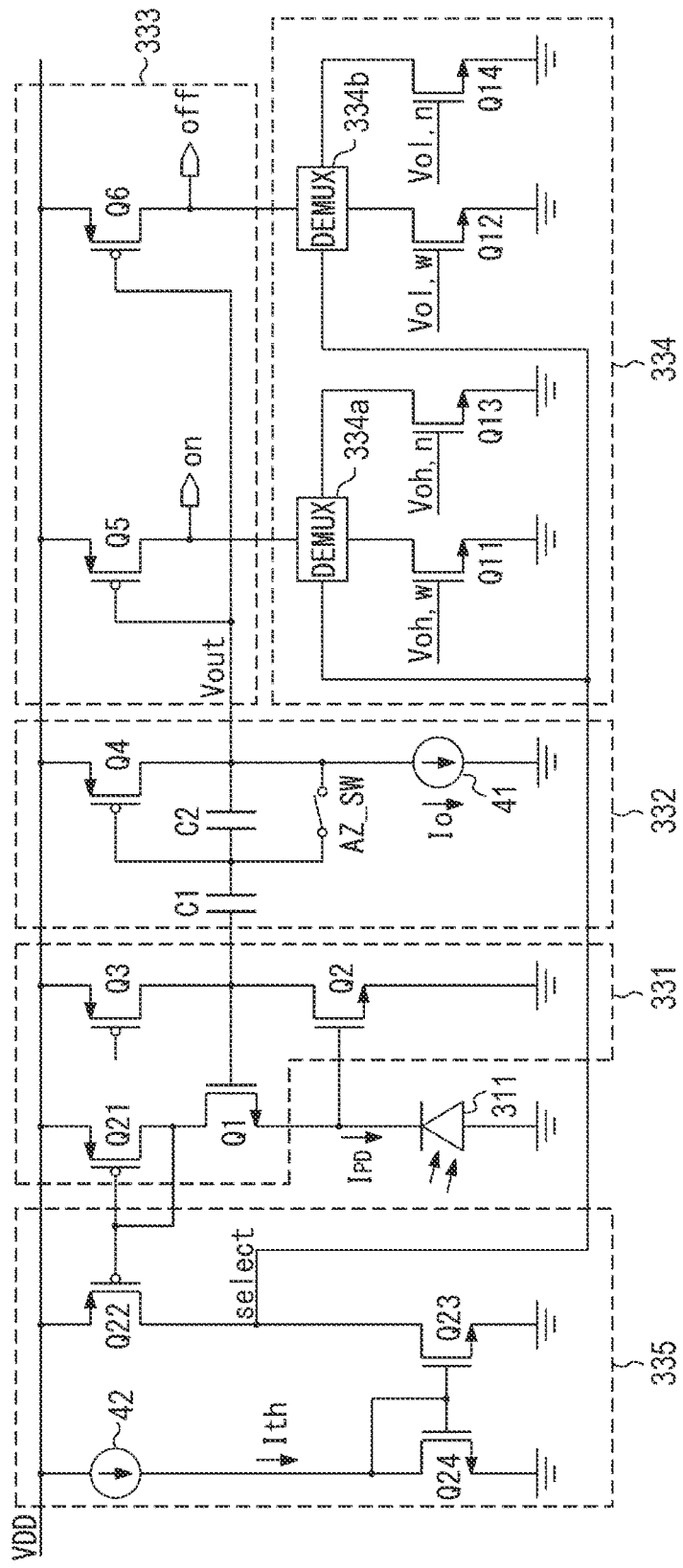
FIG. 24 is a circuit diagram of an address event detection unit according to an embodiment of the present disclosure.

FIG. 24 is a circuit diagram of the address event detection unit 33 according to an embodiment of the present disclosure. In FIG. 24, the corresponding transistors in FIG. 8 are denoted by the same reference numerals, and differences from FIG. 8 will be mainly described below. The address event detection unit 33 in FIG. 24 is obtained by adding a threshold value selection circuit 334 and a threshold value monitoring circuit 335 to the circuit configuration in FIG. 8. That is the address event detection unit 33 in FIG. 24 includes the threshold value selection circuit 334 and the threshold value monitoring circuit 335 in addition to the current-voltage conversion unit 331, the reset circuit 332, and the event detection circuit 333 similar to those in FIG. 8.

The event detection circuit 333 outputs a detection signal indicating whether or not the change amount of the electrical signal exceeds a predetermined threshold value. The electrical signal is a current flowing through the light receiving element 311. The event detection circuit 333 includes PMOS transistors Q5 and Q6. The gates of the transistors Q5 and Q6 are connected to the drain of the transistor Q4 in the reset circuit 332.

The threshold value selection circuit 334 selects a threshold value from among a plurality of threshold value candidates according to the magnitude of the electrical signal. In a case where the current flowing through the light receiving element 311 exceeds a predetermined current value, the threshold value selection circuit 334 may select a threshold value candidate having a larger absolute value as the threshold value as compared with the case where the current is equal to or less than the predetermined current value. The threshold value selection circuit 334 may select different threshold value candidates as threshold values depending on whether the electrical signal changes in an increasing direction or a decreasing direction.

More specifically, in a case where the current flowing through the photoelectric conversion element exceeds a predetermined current value, the threshold value selection circuit 334 may select, as threshold values, a first threshold value candidate in a case where the electrical signal changes in the increasing direction and a second threshold value candidate in a case where the electrical signal changes in the decreasing direction, and in a case where the current flowing through the photoelectric conversion element is equal to or less than the predetermined current value, the threshold value selection circuit 334 may select, as threshold values, a third threshold value candidate in a case where the electrical signal changes in the increasing direction and a fourth threshold value candidate in a case where the electrical signal changes in the decreasing direction. The difference between the first threshold value candidate and the second threshold value candidate may be larger than the difference between the third threshold value candidate and the fourth threshold value candidate.

The threshold value selection circuit 334 includes NMOS transistors Q11 to Q14, a first switching unit (DEMUX) 334a, and a second switching unit (DEMUX) 334b. A voltage Voh, w is input to the gate of the transistor Q11. A voltage Vol, w is input to the gate of the transistor Q12. A voltage Voh, n is input to the gate of the transistor Q13. A voltage Vol, n is input to the gate of the transistor Q14. The voltages Voh, w; Vol, w; Voh, n; and Vol, n are fixed voltages, and the transistors Q11 to Q14 each act as a current source. Hereinafter, the transistors Q11 to Q14 may be referred to as first to fourth current sources.

In a case where the current flowing through the light receiving element 311 exceeds the predetermined current value, the first switching unit 334a connects the first current source including the transistor Q11 to the output current path of the transistor Q5 and connects the second current source including the transistor Q12 to the output current path of the transistor Q6.

In a case where the current flowing through the light receiving element 311 is equal to or less than the predetermined current value, the second switching unit 334b connects the third current source including the transistor Q13 to the output current path of the transistor Q5 and connects the fourth current source including the transistor Q14 to the output current path of the transistor Q6.

As described above, in a case where the current flowing through the light receiving element 311 exceeds the predetermined current value, the threshold value selection circuit 334 functions as a first selection unit that cascode-connects the transistors Q5 and Q11 and cascode-connects the transistors Q6 and Q12. Furthermore, in a case where the current flowing through the light receiving element 311 is within the predetermined current value, the threshold value selection circuit 334 functions as a second selection unit that cascode-connects the transistors Q5 and Q13 and cascode-connects the transistors Q6 and Q14.

Figure 25:
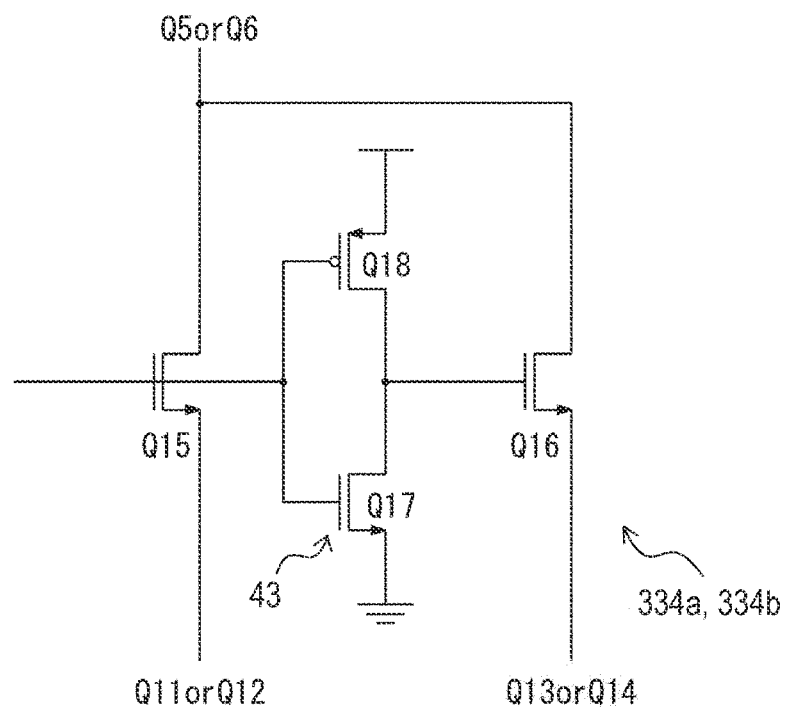
FIG. 25 is a circuit diagram illustrating an example of an internal configuration of a first switching unit and a second switching unit.

FIG. 25 is a circuit diagram illustrating an example of an internal configuration of the first switching unit 334a and the second switching unit 334b in threshold value selection circuit 334. Since the internal configurations of the first switching unit 334a and the second switching unit 334b are the same, the circuit diagram of FIG. 25 will be described by taking the first switching unit 334a as an example.

The first switching unit 334a in FIG. 25 includes NMOS transistors Q15 to Q17 and a PMOS transistor Q18. The transistor Q15 is connected between the drain of the transistor Q5 and the drain of the transistor Q11. The transistor Q16 is connected between the drain of the transistor Q5 and the drain of the transistor Q13. An output signal of a threshold value monitoring circuit 335 to be described later is input to a gate of the transistor Q15.

The output signal of the threshold value monitoring circuit 335 is inverted by an inverter 43 and then input to the gate of the transistor Q16. The inverter 43 includes transistors Q18 and Q17 cascode-connected between the power supply voltage node VDD and the ground node.

Note that the circuit of FIG. 25 is an example of an internal configuration of the first switching unit 334a and the second switching unit 334b, and various modifications are conceivable.

The threshold value monitoring circuit 335 in FIG. 24 includes a PMOS transistor Q22, NMOS transistors Q23 and Q24, and a current source (reference current source) 42.

Transistors Q21 and Q22 constitute a current mirror circuit, and a current proportional to the current flowing through the light receiving element 311 flows between the source and the drain of the transistor Q22. The transistors Q22 and Q23 are cascode-connected between the power supply voltage node VDD and the ground node. The transistors Q23 and Q24 constitute a current mirror circuit. The current source 42 is connected to the drain of the transistor Q24. A voltage signal (SELECT signal) indicating a comparison result between a current IPD flowing through the light receiving element 311 and a current Ith output from the current source 42 is output from the drain of the transistor Q23.

More specifically, in a case of IPD≤Ith, the SELECT signal output from the threshold value monitoring circuit 335 becomes a low level, and in a case of IPD>Ith, the SELECT signal becomes a high level. When the SELECT signal is at the high level (in the case of IPD>Ith), the first switching unit 334*a* cascode-connects the transistor Q11 to the transistor Q5, and the second switching unit 334*b* cascode-connects the transistor Q12 and the transistor Q6. Furthermore, when the SELECT signal is at the low level (in the case of IPD≤Ith), the first switching unit 334*a* cascode-connects the transistor Q13 to the transistor Q5, and the second switching unit 334*b* cascode-connects the transistor Q14 and the transistor Q6.

Figure 26:
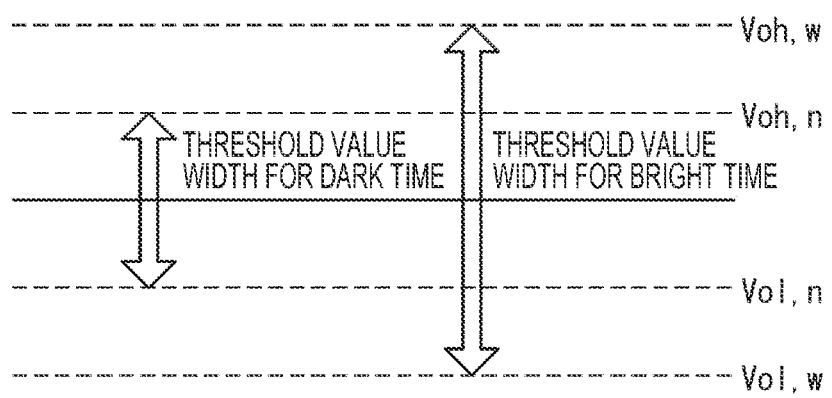
FIG. 26 is a diagram illustrating a voltage level of a threshold value voltage of a transistor.

FIG. 26 is a diagram illustrating voltage levels of the threshold value voltages Voh, w; Vol, w; Voh, n; and Vol, n of the transistors Q11 to Q14. As illustrated in the drawing, the voltage widths (threshold value widths) of the threshold value voltages Voh, w and Vol, w selected in a case where the current flowing through the light receiving element 311 exceeds the predetermined current value are larger than the voltage widths (threshold value widths) of the threshold value voltages Voh, n and Vol, n selected in a case where the current flowing through the light receiving element 311 is within the predetermined current value. By making the threshold value width at dark time narrower than the threshold value width at bright time, the event detection at dark time can be performed at high speed.

Figure 27:
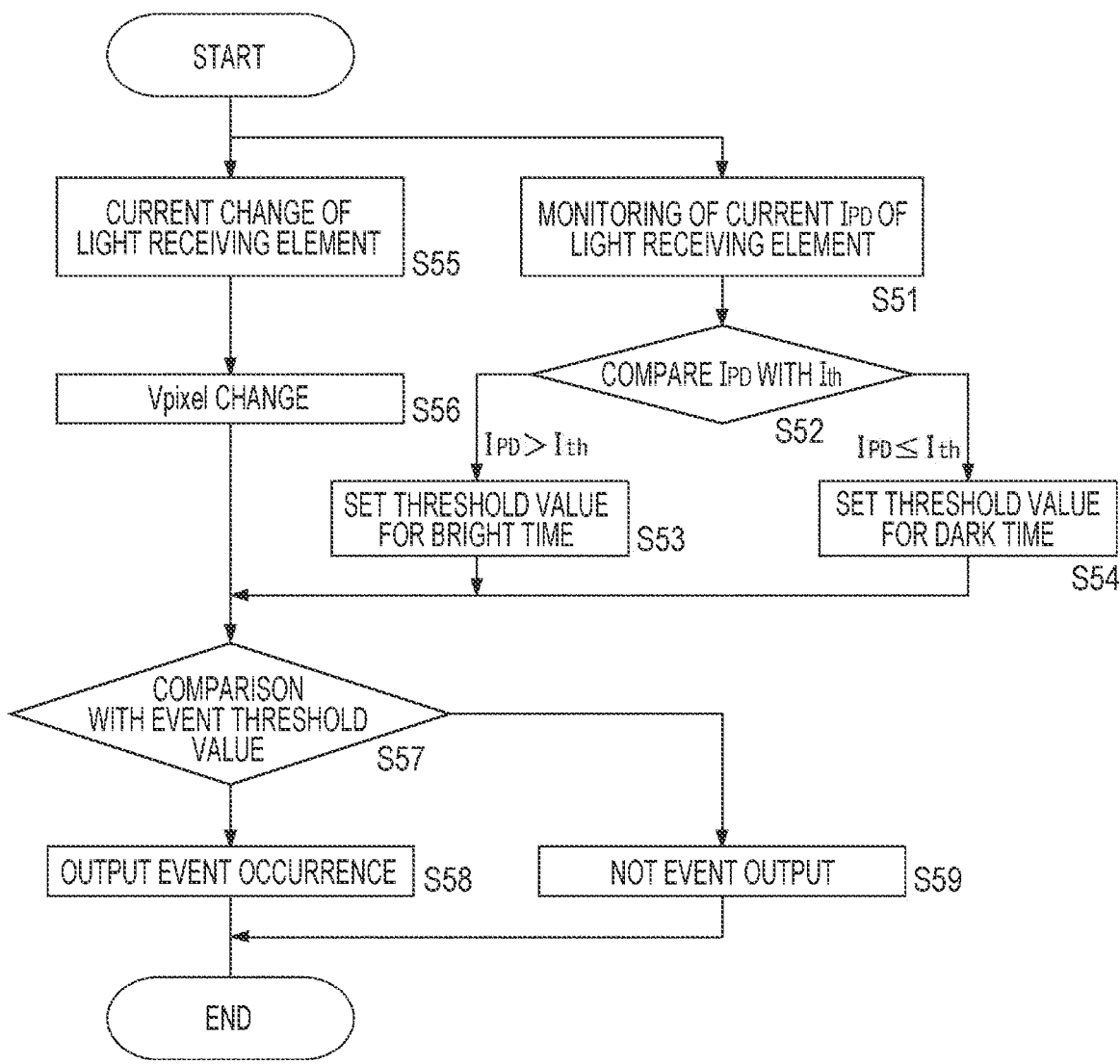
FIG. 27 is a flowchart illustrating a processing operation of the address event detection unit in FIG. 24.

FIG. 27 is a flowchart illustrating a processing operation of the address event detection unit 33 in FIG. 24. The analog event detection unit 33 repeatedly performs the processing of FIG. 27 while the power supply voltage is supplied to the imaging device 20.

The threshold value monitoring circuit 335 monitors the current IPD flowing through the light receiving element 311 (step S51). Next, the threshold value monitoring circuit 335 compares the current IPD flowing through the light receiving element 311 with the current Ith output from the current source 42 (step S52).

If IPD>Ith, the threshold value voltages Voh, w and Vol, w for bright time are selected (step S53). In this case, the threshold value monitoring circuit 335 sets the SELECT signal to the high level, and the threshold value selection circuit 334 cascode-connects the transistor Q11 of which the gate receives the threshold value voltage Voh, w to the transistor Q5, and cascode-connects the transistor Q12 of which gate the receives the threshold value voltage Vol, w to the transistor Q6.

On the other hand, if IPD≤Ith, the threshold value voltages Voh, n and Vol, n for dark time are selected (step S54). In this case, the threshold value monitoring circuit 335 sets the SELECT signal to the low level, and the threshold value selection circuit 334 cascode-connects the transistor Q13 of which the gate receives the threshold value voltage Voh, n to the transistor Q5, and cascode-connects the transistor Q14 of which gate the receives the threshold value voltage Vol, n to the transistor Q6.

In parallel with the processing of steps S51 to S54, when the current flowing through the light receiving element 311 changes (step S55), the event detection circuit 333 detects the voltage change amount of the pixel output voltage Vpixel (step S56). Then, the voltage change amount of the pixel output voltage Vpixel is compared with the threshold value voltage selected in step S53 or S54 (step S57), and if the absolute value of the voltage change amount of the pixel output voltage Vpixel is larger than the threshold value voltage selected in step S53 or S54, occurrence of an event is output (step S58), and if the absolute value is equal to or less than the threshold voltage, no event is output (step S59).

As illustrated in FIG. 10, steps S58 and S59 represent whether an event has occurred or there is no event by the logic of the event signal Von output from the On output node and the event signal Voff output from the Off output node.

Figure 28:
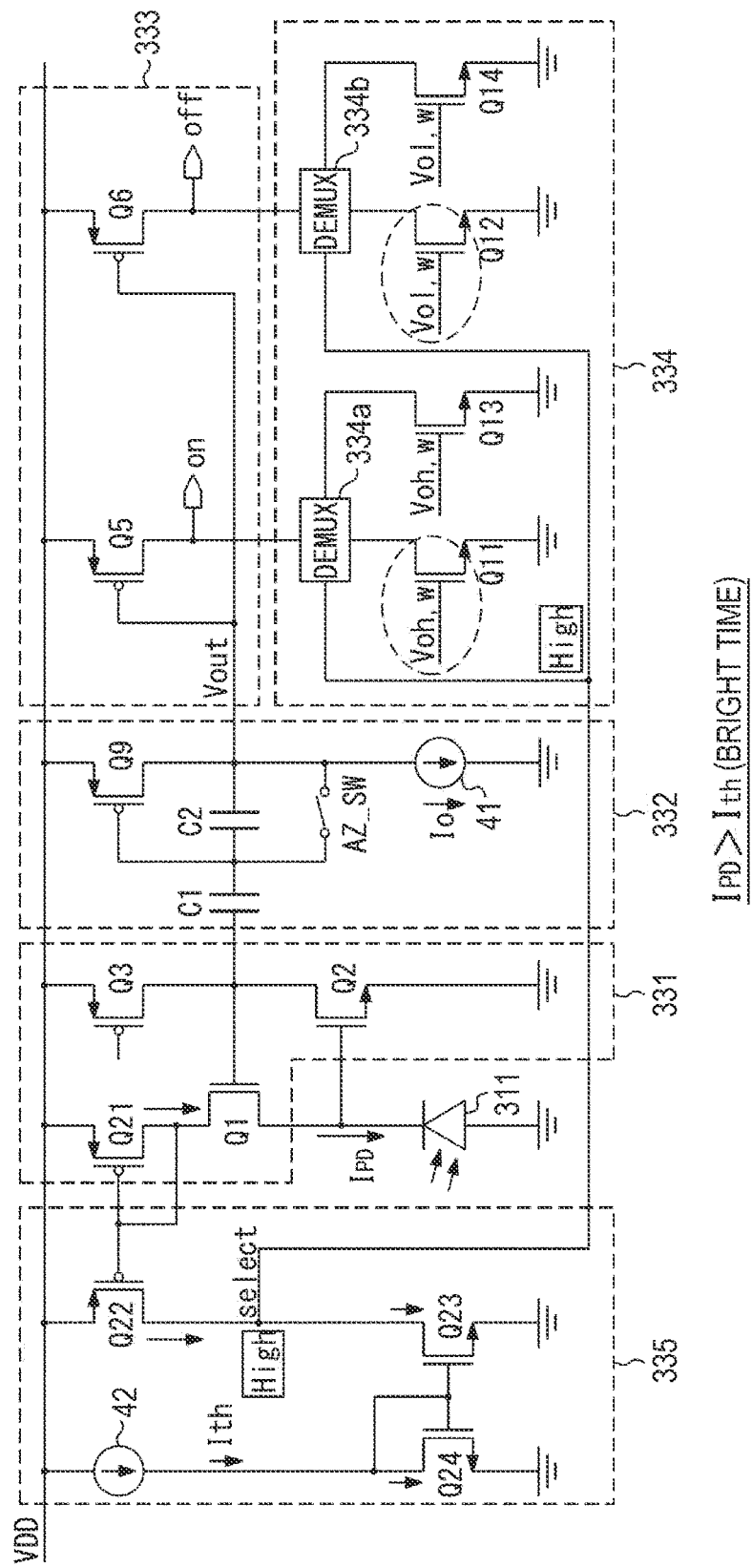
FIG. 28 is a diagram illustrating a flow of a signal in an address event detection unit 33 at bright time.

FIG. 28 is a diagram illustrating a flow of a signal in the address event detection unit 33 at bright time (IPD>Ith). As illustrated in FIG. 28, at bright time, the threshold value monitoring circuit 335 sets the SELECT signal to the high level. Therefore, the threshold value selection circuit 334 cascode-connects the transistor Q11 to the transistor Q5 and cascode-connects the transistor Q12 to the transistor Q6.

Figure 29:
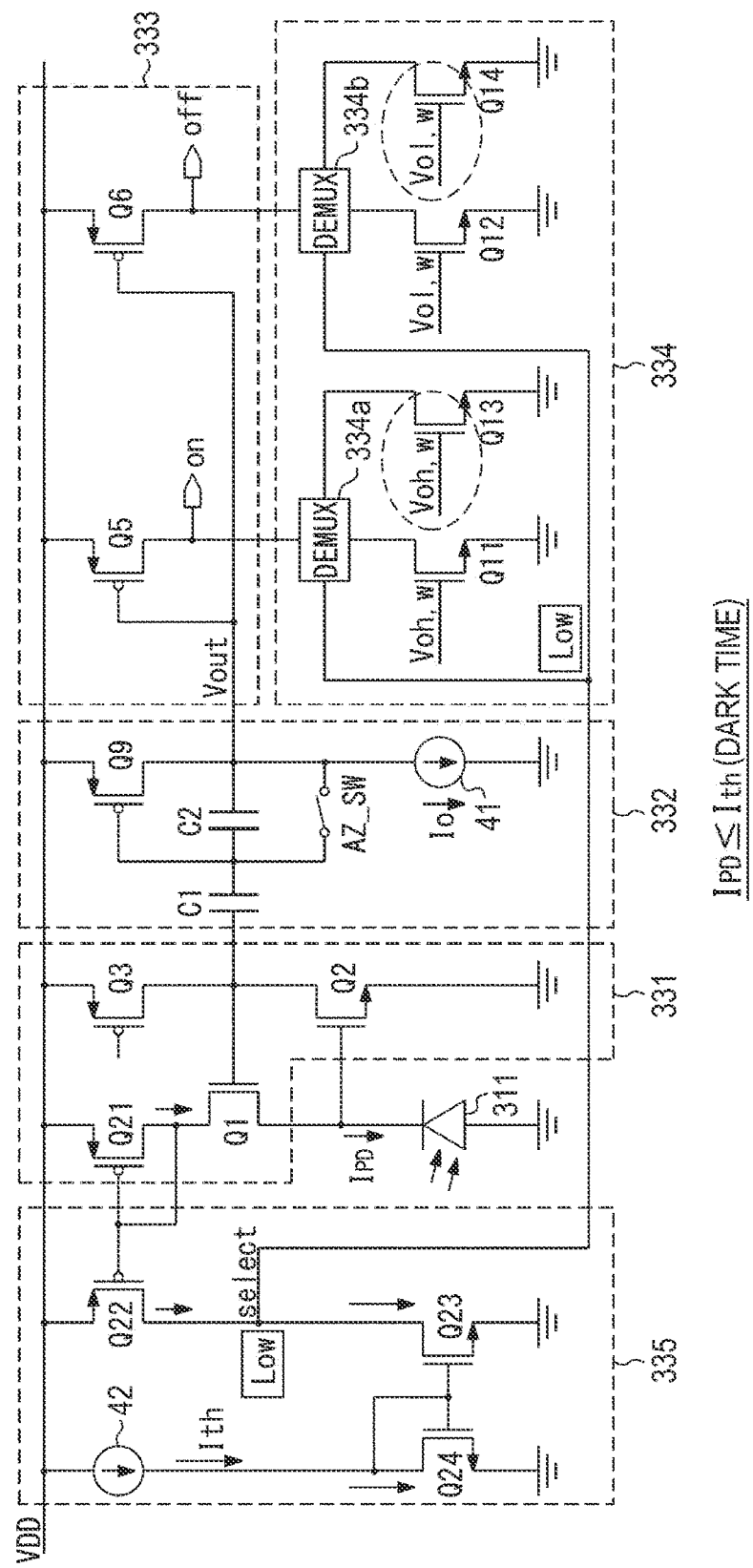
FIG. 29 is a diagram illustrating a flow of a signal in the address event detection unit 33 at dark time.

FIG. 29 is a diagram illustrating a flow of a signal in the address event detection unit 33 at dark time (IPD≤Ith). As illustrated in FIG. 29, at dark time, the threshold value monitoring circuit 335 sets the SELECT signal to the low level. Therefore, the threshold value selection circuit 334 cascode-connects the transistor Q13 to the transistor Q5 and cascode-connects the transistor Q14 to the transistor Q6.

FIG. 30A is a graph comparing characteristics of a delay time when the event signal Von rises between FIGS. 24 and 8. FIG. 30B is a graph comparing characteristics of a delay time when the event signal Von falls between FIGS. 24 and 8.

In FIGS. 30A and 30B, the horizontal axis indicates the current flowing through the light receiving element 311, and the vertical axis indicates the delay time. Waveforms w5 and w7 indicate characteristic curves of the analog event detection unit 33 in FIG. 24, and waveforms w6 and w8 indicate characteristic curves of the analog event detection unit 33 in FIG. 8. The left side of FIGS. 30A and 30B indicates that the luminance is lower. At dark time, the difference between the waveforms w5 and w6 in the vertical axis direction and the difference between the waveforms w7 and w8 in the vertical axis direction are larger, indicating that the analog event detection unit 33 in FIG. 24 has excellent response time at dark time.

Figure 31:
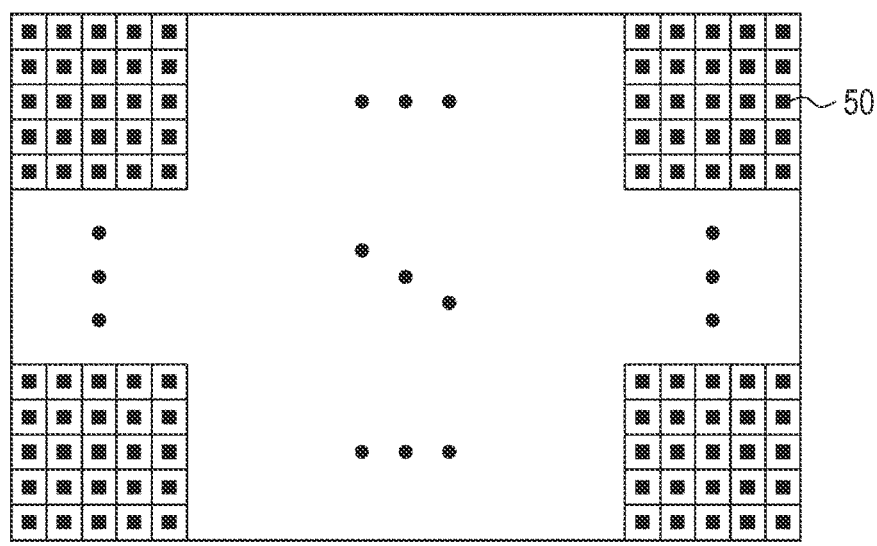
FIG. 31 is a diagram illustrating an example in which a threshold value selection circuit and a threshold value monitoring circuit in FIG. 24 are provided in association with each pixel of the imaging device.

FIG. 31 is a diagram illustrating an example in which the threshold value selection circuit 334 and the threshold value monitoring circuit 335 in FIG. 24 are provided in association with each pixel of the imaging device 20. Each black square 50 in FIG. 31 indicates the threshold value selection circuit 334 and the threshold value monitoring circuit 335 provided in association with each pixel.

As illustrated in FIG. 6, the imaging device 20 according to the present embodiment can include two chips. For example, the light receiving element 311 in FIG. 24 may be arranged on the upper side light receiving chip in FIG. 6, and the threshold value selection circuit 334 and the threshold value monitoring circuit 335 in FIG. 24 may be arranged on the lower side detection chip in FIG. 6.

Figure 32:
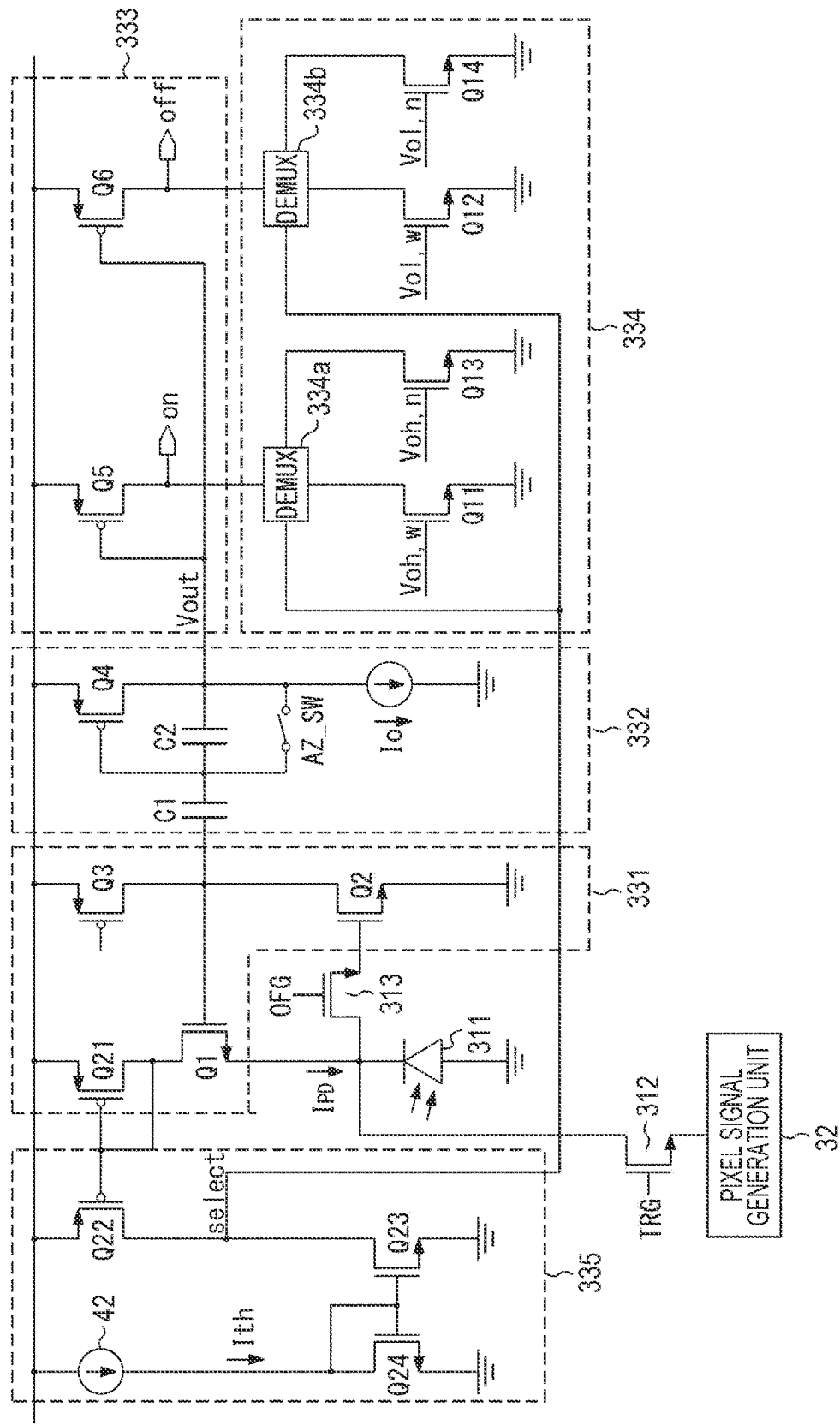
FIG. 32 is a circuit diagram in which a transfer transistor and an OFG transistor in FIG. 4 are added to a light receiving element in FIG. 24, and a pixel signal generation unit is added.

FIG. 32 is a circuit diagram in which the transfer transistor 312 and the OFG transistor 313 in FIG. 4 are added to the light receiving element 311 in FIG. 24, and the pixel signal generation unit 32 is added. The OFG transistor 313 is connected between the cathode of the light receiving element 311 and the gate of the transistor Q2 in the address event detection unit 33. The transfer transistor 312 is connected between the cathode of the light receiving element 311 and the input node of the pixel signal generation unit 32.

As described above, the address event detection unit 33 in the imaging device 20 according to the first embodiment changes the threshold value width for determining whether or not an event has occurred according to whether or not the current flowing through the light receiving element 311 exceeds the predetermined threshold value. This makes it possible to quickly detect that an event has occurred at dark time. Furthermore, since the threshold value width at bright time is the same as before, there is no possibility that a large amount of noise is included in the event detected at bright time.

Second Embodiment

Figure 33:
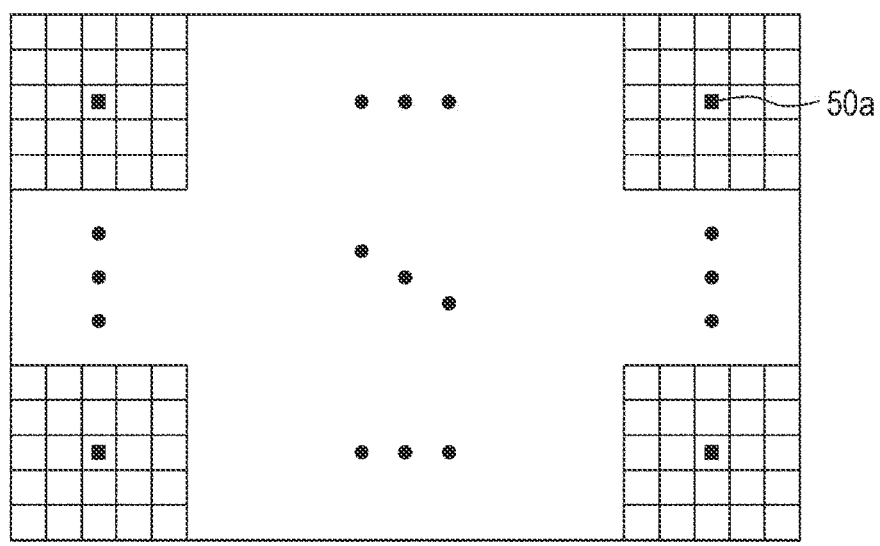
FIG. 33 is a diagram illustrating an example in which one threshold value monitoring circuit is provided for every pixel group including a plurality of pixels.

The threshold value monitoring circuit 335 in FIG. 24 may be shared by a plurality of pixels. FIG. 33 is a diagram illustrating an example in which one threshold value monitoring circuit 335 is provided for every pixel group including a plurality of pixels. A black square 50*a* in FIG. 33 represents the threshold value monitoring circuit 335. On the other hand, the threshold value selection circuit 334 is provided for every pixel. In this case, the threshold value monitoring circuit 335 may monitor the current flowing through the light receiving element 311 in a specific pixel in the corresponding pixel group. Alternatively, the threshold value monitoring circuit 335 may monitor the average value of the currents flowing through all the light receiving elements 311 in all the pixels in the corresponding pixel group.

As illustrated in FIG. 24, by sharing the threshold value monitoring circuit 335 among a plurality of pixels, the mounting area of the imaging device 20 can be reduced.

Third Embodiment

Although the threshold value monitoring circuit 335 of FIG. 24 includes the current source 42, the current source 42 may be provided separately from the threshold value monitoring circuit 335 in a manner that the current output from the current source 42 can be variably controlled.

Figure 34:
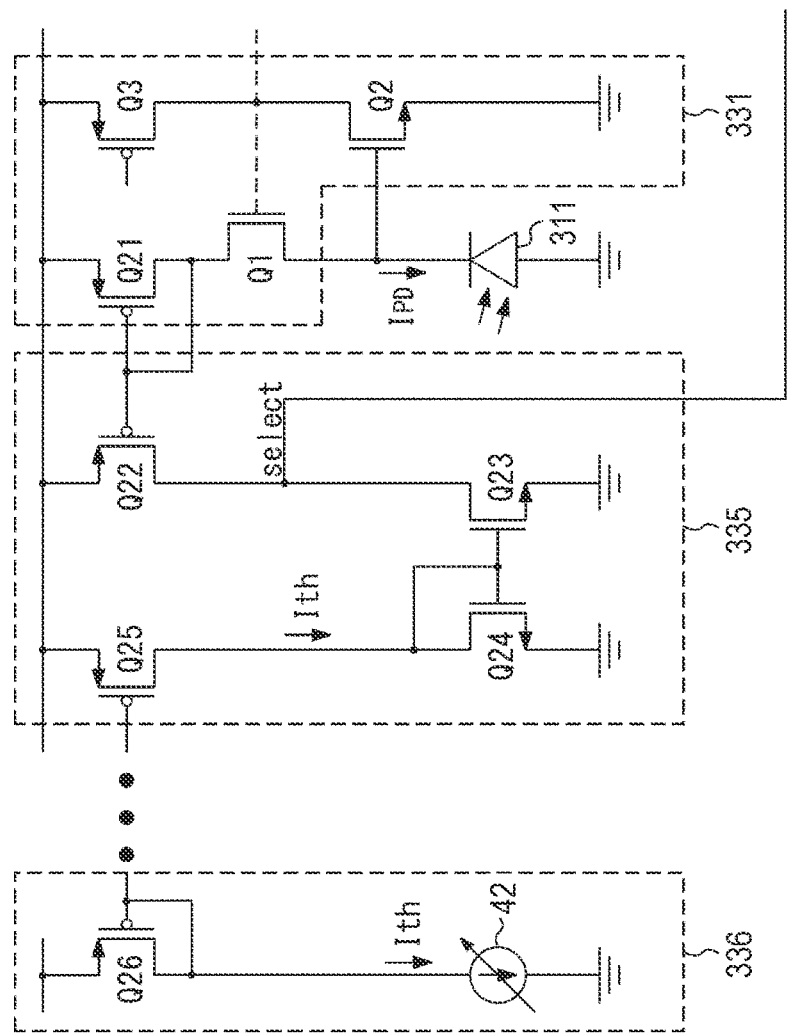
FIG. 34 is a circuit diagram illustrating an example in which a current control circuit having a current source is provided separately from the threshold value monitoring circuit.

FIG. 34 is a circuit diagram illustrating an example in which a current control circuit 336 having the current source 42 is provided separately from the threshold value monitoring circuit 335. The current control circuit 336 includes a PMOS transistor Q26 and the current source 42 connected between the power supply voltage node VDD and the ground node. The transistor Q26 constitutes a current mirror circuit with a PMOS transistor Q25 in the threshold value monitoring circuit 335. The transistors Q25 and Q24 are cascode-connected between the power supply voltage node VDD and the ground node.

The current source 42 is a variable current source capable of controlling the current Ith. By controlling the current Ith by the current source 42, the magnitude relationship between the current IPD flowing through the light receiving element 311 and the current Ith can be arbitrarily switched. Therefore, it is possible to arbitrarily adjust how bright the surroundings of the imaging device 20 are when the threshold value width is switched by the threshold value selection circuit 334.

Figure 35:
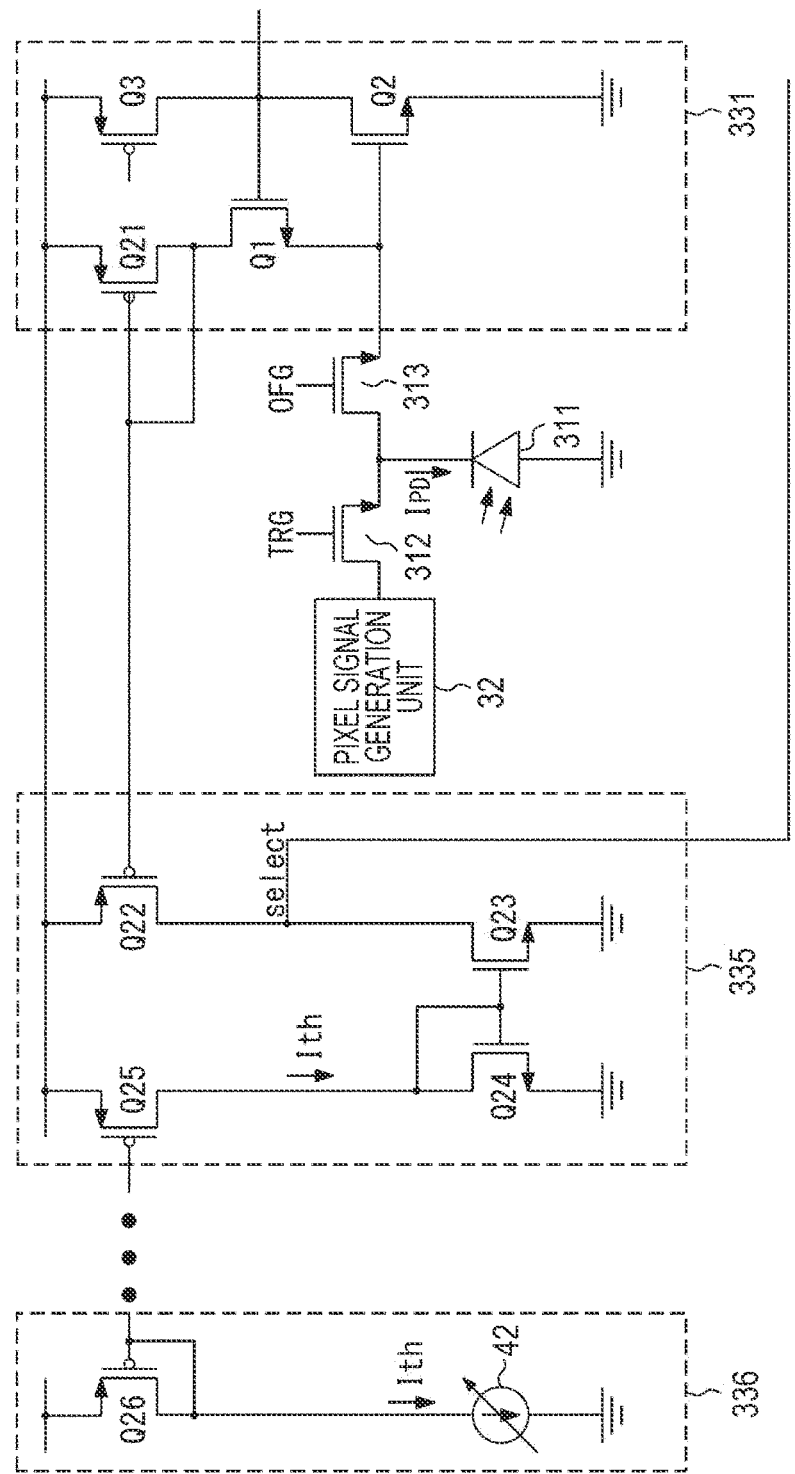
FIG. 35 is a circuit diagram in which the transfer transistor, the OFG transistor, and the pixel signal generation unit are added to FIG. 34.

FIG. 35 is a circuit diagram in which the transfer transistor 312, the OFG transistor 313, and the pixel signal generation unit 32 are added to FIG. 34. The OFG transistor 313 is connected between the cathode of the light receiving element 311 and the gate of the transistor Q2 in the address event detection unit 33. The transfer transistor 312 is connected between the cathode of the light receiving element 311 and the input node of the pixel signal generation unit 32.

As described above, in the third embodiment, since the current control circuit 336 including the variable current source 42 is provided separately from the threshold value monitoring circuit 335, the luminance for switching the threshold value width in the threshold value selection circuit 334 can be switched according to the situation.

Note that the present technology can have the following configurations.

(1) An imaging device including:
a photoelectric conversion element that photoelectrically converts incident light and generates an electrical signal corresponding to incident light intensity;
a detection unit that outputs a detection signal indicating whether or not a change amount of the electrical signal exceeds a predetermined threshold value; and
a threshold value selection circuit that selects the threshold value from among a plurality of threshold value candidates according to a magnitude of the electrical signal.

(2) The imaging device according to (1), in which
the electrical signal is a current flowing through the photoelectric conversion element, and
the threshold value selection circuit selects the threshold value candidates different from each other as the threshold value depending on whether or not a current flowing through the photoelectric conversion element exceeds a predetermined current value.

(3) The imaging device according to (2), in which in a case where the current flowing through the photoelectric conversion element exceeds the predetermined current value, the threshold value selection circuit selects the threshold value candidate having a larger absolute value as the threshold value as compared with a case where the current flowing through the photoelectric conversion element is equal to or less than the predetermined current value.

(4) The imaging device according to any one of (1) to (3), in which the threshold value selection circuit selects the different threshold value candidates as the threshold value depending on whether the electrical signal changes in an increasing direction or a decreasing direction.

(5) The imaging device according to (4), in which
in a case where the current flowing through the photoelectric conversion element exceeds the predetermined current value, the threshold value selection circuit selects, as the threshold value, a first threshold value candidate in a case where the electrical signal changes in the increasing direction and a second threshold value candidate in a case where the electrical signal changes in the decreasing direction, and
in a case where the current flowing through the photoelectric conversion element is equal to or less than the predetermined current value, the threshold value selection circuit selects, as the threshold value, a third threshold value candidate in a case where the electrical signal changes in the increasing direction and a fourth threshold value candidate in a case where the electrical signal changes in the decreasing direction.

(6) The imaging device according to (5), in which a difference between the first threshold value candidate and the second threshold value candidate is larger than a difference between the third threshold value candidate and the fourth threshold value candidate.

(7) The imaging device according to (5) or (6), in which
the detection unit includes a first transistor and a second transistor that output a signal corresponding to the change amount of the electrical signal,
the threshold value selection circuit includes a first current source that causes a current corresponding to the first threshold value candidate to flow, a second current source that causes a current corresponding to the second threshold value candidate to flow, a third current source that causes a current corresponding to the third threshold value candidate to flow, and a fourth current source that causes a current corresponding to the fourth threshold value candidate to flow, in a case where the current flowing through the photoelectric conversion element exceeds the predetermined current value, a switching unit connects the first current source to an output current path of the first transistor and connects the second current source to an output current path of the second transistor, and in a case where a current flowing through the photoelectric conversion element is equal to or less than the predetermined current value, the switching unit connects the third current source to the output current path of the first transistor, and connects the fourth current source to the output current path of the second transistor.

(8) The imaging device according to (7), in which
the first current source is a third transistor having a gate to which a voltage of the first threshold value candidate is input,
the second current source is a fourth transistor having a gate to which a voltage of the second threshold value candidate is input,
the third current source is a fifth transistor having a gate to which a voltage of the third threshold value candidate is input, and
the fourth current source is a sixth transistor having a gate to which a voltage of the fourth threshold value candidate is input.

(9) The imaging device according to (8), in which
the threshold value selection circuit includes
a first selection unit that switches the third transistor or the fifth transistor to be cascode-connected to the first transistor depending on whether or not the current flowing through the photoelectric conversion element exceeds the predetermined current value, and
a second selection unit that switches the fourth transistor or the sixth transistor to be cascode-connected to the second transistor depending on whether or not the current flowing through the photoelectric conversion element exceeds the predetermined current value.

(10) The imaging device according to (9), in which the first selection unit and the second selection unit perform switching on the basis of a result of comparison between the current flowing through the photoelectric conversion element and a predetermined reference current.

(11) The imaging device according to (10), further including:
a reference current source that generates the predetermined reference current; and
a monitoring circuit that compares the predetermined reference current with the current flowing through the photoelectric conversion element and outputs a voltage signal indicating a comparison result, in which
the first selection unit and the second selection unit perform switching on the basis of the voltage signal.

(12) The imaging device according to (11), further including:
a pixel array unit including a plurality of pixel circuits each including the photoelectric conversion element, in which
a threshold value variable circuit including the detection unit and the threshold value selection circuit, and the monitoring circuit are provided for each of the plurality of pixel circuits.

(13) The imaging device according to (12), further including:
a pixel array unit including the plurality of pixel circuits each including the photoelectric conversion element, in which
the threshold value variable circuit including the detection unit and the threshold value selection circuit is provided for each of the plurality of pixel circuits, and
the monitoring circuit is provided for every pixel group including two or more pixel circuits among the plurality of pixel circuits.

(14) The imaging device according to (12) or (13), further including:
a first substrate on which the pixel array unit is arranged; and
a second substrate laminated on the first substrate and on which the threshold value variable circuit and the monitoring circuit are arranged.

(15) The imaging device according to (14), in which the first substrate and the second substrate are bonded to each other by any of a chip on chip (CoC) method, a chip on wafer (CoW) method, or a wafer on wafer (WoW) method.

(16) The imaging device according to any one of (12) to (15), in which
the reference current source is provided separately from the pixel circuit, and
the reference current source can vary the reference current.

(17) An imaging method including:
photoelectrically converting incident light and generating an electrical signal corresponding to incident light intensity by a photoelectric conversion element;
outputting a detection signal indicating whether or not a change amount of the electrical signal exceeds a predetermined threshold value; and
selecting the threshold value from among a plurality of threshold value candidates according to a magnitude of the electrical signal.

Aspects of the present disclosure are not limited to the above-described individual embodiments, and include various modifications that can be conceived by those skilled in the art, and the effects of the present disclosure are not limited to the above-described contents. That is various additions, modifications, and partial deletions can be made without departing from the conceptual idea and scope of the present disclosure derived from the contents defined in the claims and their equivalents.

REFERENCE SIGNS LIST

10 Imaging system
20 Imaging device
21 Pixel array unit
22 Drive unit
23 Arbiter unit
24 Column processing unit
25 Signal processing unit
30 Pixel
31 Light receiving unit
32 Pixel signal generation unit
33 Address event detection unit
201 Light receiving chip 202 Detection chip
241 Analog-digital conversion unit
311 Light receiving element
312 Transfer transistor
313 OFG transistor
321 Reset transistor
322 Amplification transistor
323 Selection transistor
324 Floating diffusion layer
331 Current-voltage conversion unit
332 Reset circuit
333 Event detection circuit
334 Threshold value selection circuit
334a First switching unit
334b Second switching unit
335 Threshold value monitoring circuit
336 Current control circuit

The invention claimed is:

1. An imaging device, comprising:
a photoelectric conversion element configured to photoelectrically convert incident light and generate an electrical signal corresponding to intensity of the incident light;
a threshold value selection circuit configured to select a specific threshold value from a plurality of threshold value candidates based on a current that flows through the photoelectric conversion element exceeds a specific current value; and
a detection unit configured to output a detection signal that indicates whether a change amount of the electrical signal exceeds the specific threshold value.

2. The imaging device according to claim 1, wherein the electrical signal is the current that flows through the photoelectric conversion element.

3. The imaging device according to claim 2, wherein based on the current that flows through the photoelectric conversion element exceeds the specific current value, the threshold value selection circuit is further configured to select a threshold value candidate having a larger absolute value as the specific threshold value as compared with a case where the current that flows through the photoelectric conversion element is equal to or less than the specific current value.

4. The imaging device according to claim 1, wherein the threshold value selection circuit is further configured to select the specific threshold value based on change in the electrical signal in one of an increasing direction or a decreasing direction.

5. The imaging device according to claim 4, wherein based on the current that flows through the photoelectric conversion element exceeds the specific current value, the threshold value selection circuit is further configured to select, as the specific threshold value, a first threshold value candidate of the plurality of threshold value candidates in a case where the electrical signal changes in the increasing direction and a second threshold value candidate of the plurality of threshold value candidates in a case where the electrical signal changes in the decreasing direction, and
based on the current that flows through the photoelectric conversion element is equal to or less than the specific current value, the threshold value selection circuit is further configured to select, as the specific threshold value, a third threshold value candidate of the plurality of threshold value candidates in a case where the electrical signal changes in the increasing direction and a fourth threshold value candidate of the plurality of threshold value candidates in a case where the electrical signal changes in the decreasing direction.

6. The imaging device according to claim 5, wherein a difference between the first threshold value candidate and the second threshold value candidate is larger than a difference between the third threshold value candidate and the fourth threshold value candidate.

7. The imaging device according to claim 5, further comprising a switching unit, wherein
the detection unit includes a first transistor and a second transistor configured to output a signal corresponding to the change amount of the electrical signal,
the threshold value selection circuit includes:
a first current source configured to control a first current corresponding to the first threshold value candidate to flow,
a second current source configured to control a second current corresponding to the second threshold value candidate to flow,
a third current source configured to control a third current corresponding to the third threshold value candidate to flow, and
a fourth current source configured to control a fourth current corresponding to the fourth threshold value candidate to flow,
based on the current that flows through the photoelectric conversion element exceeds the specific current value, the switching unit is configured to connect the first current source to an output current path of the first transistor and connect the second current source to an output current path of the second transistor, and
based on the current that flows through the photoelectric conversion element is equal to or less than the specific current value, the switching unit is further configured to connect the third current source to the output current path of the first transistor, and connect the fourth current source to the output current path of the second transistor.

8. The imaging device according to claim 7, wherein
the first current source is a third transistor having a gate to which a voltage of the first threshold value candidate is input,
the second current source is a fourth transistor having a gate to which a voltage of the second threshold value candidate is input,
the third current source is a fifth transistor having a gate to which a voltage of the third threshold value candidate is input, and
the fourth current source is a sixth transistor having a gate to which a voltage of the fourth threshold value candidate is input.

9. The imaging device according to claim 8, wherein the threshold value selection circuit includes:
a first selection unit configured to switch one of the third transistor or the fifth transistor to be cascode-connected to the first transistor based on the current that flows through the photoelectric conversion element exceeds the specific current value, and
a second selection unit configured to switch one of the fourth transistor or the sixth transistor to be cascode-connected to the second transistor based on the current that flows through the photoelectric conversion element exceeds the specific current value.

10. The imaging device according to claim 9, wherein each of the first selection unit and the second selection unit is configured to perform a switching process based on a result of comparison between the current that flows through the photoelectric conversion element and a specific reference current.

11. The imaging device according to claim 10, further comprising:
a reference current source configured to generate the specific reference current; and
a monitoring circuit configured to compare the specific reference current with the current that flows through the photoelectric conversion element and output a voltage signal that indicates the result of comparison, wherein each of the first selection unit and the second selection unit is configured to perform the switching process based on the voltage signal.

12. The imaging device according to claim 11, further comprising:
a pixel array unit including a plurality of pixel circuits, wherein
each of the plurality of pixel circuits includes the photoelectric conversion element,
each of the plurality of pixel circuits further includes a threshold value variable circuit and the monitoring circuit, and
the threshold value variable circuit includes the detection unit and the threshold value variable circuit.

13. The imaging device according to claim 12, wherein
a set of pixel circuits of the plurality of pixel circuits includes the monitoring circuit, and
the set of pixel circuits includes at least two pixel circuits among the plurality of pixel circuits.

14. The imaging device according to claim 12, further comprising:
a first substrate, wherein the pixel array unit is on the first substrate; and
a second substrate laminated on the first substrate, wherein the threshold value variable circuit and the monitoring circuit are on the second substrate.

15. The imaging device according to claim 14, wherein the first substrate is bonded to the second substrate by one of a chip on chip (CoC) method, a chip on wafer (CoW) method, or a wafer on wafer (WoW) method.

16. The imaging device according to claim 12, wherein
the specific reference current corresponding to the reference current source is variable.

17. An imaging method, comprising:
photoelectrically converting incident light and generating an electrical signal corresponding to an intensity of the incident light;
selecting a specific threshold value from a plurality of threshold value candidates based on a current that flows through the photoelectric conversion element exceeds a specific current value; and
outputting a detection signal indicating whether or not a change amount of the electrical signal exceeds the specific threshold value.

* * * * *